US011011088B2

United States Patent
Liao et al.

(10) Patent No.: US 11,011,088 B2
(45) Date of Patent: May 18, 2021

(54) SHIFT REGISTER UNIT, DRIVING METHOD, GATE DRIVE CIRCUIT, AND DISPLAY DEVICE

(71) Applicants: BOE Technology Group Co., Ltd., Beijing (CN); Hefei BOE Optoelectronics Technology Co., Ltd., Hefei (CN)

(72) Inventors: Liqing Liao, Beijing (CN); Hongmin Li, Beijing (CN); Dong Wang, Beijing (CN); Fengjing Tang, Beijing (CN)

(73) Assignees: BOE TECHNOLOGY GROUP CO., LTD., Beijing (CN); HEFEI BOE OPTOELECTRONICS TECHNOLOGY GROUP CO., LTD., Hefei (CN)

( * ) Notice: Subject to any disclaimer, the term of this patent is extended or adjusted under 35 U.S.C. 154(b) by 191 days.

(21) Appl. No.: 16/125,969

(22) Filed: Sep. 10, 2018

(65) Prior Publication Data
US 2019/0287446 A1   Sep. 19, 2019

(30) Foreign Application Priority Data

Mar. 15, 2018   (CN) .......................... 201810212929.9

(51) Int. Cl.
*G11C 19/00* (2006.01)
*G09G 3/20* (2006.01)
(Continued)

(52) U.S. Cl.
CPC ............. *G09G 3/20* (2013.01); *G09G 3/3677* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS

2010/0259525 A1   10/2010   Ohkawa et al.
2012/0242630 A1   9/2012   Ohara et al.
(Continued)

FOREIGN PATENT DOCUMENTS

CN   101868833 A   10/2010
CN   102945651 A   2/2013
(Continued)

OTHER PUBLICATIONS

First office action of Chinese application No. 201810212929.9 dated Oct. 24, 2019.

*Primary Examiner* — Tuan T Lam
(74) *Attorney, Agent, or Firm* — Fay Sharpe LLP

(57) ABSTRACT

A shift register unit, a driving method, a gate drive circuit and a display device are provided. The shift register unit includes: an input sub-circuit used to control an electric potential of the pull-up node, an output sub-circuit used to input a first clock signal from a first clock signal terminal to the output terminal, a pull-down control sub-circuit used to control an electric potential of the pull-down node, a pull-down sub-circuit used to control electric potentials of the pull-up node and the output terminal, a first reset control sub-circuit used to control an electric potential of the second control node under control of the first control node and a reset signal from the reset signal terminal and a reset sub-circuit used to control the electric potential of the pull-up node. The shift register unit improves the noise reduction efficiency at the output terminal.

18 Claims, 10 Drawing Sheets

(51) Int. Cl.
*G11C 19/28* (2006.01)
*G09G 3/36* (2006.01)
(52) U.S. Cl.
CPC ............... *G09G 2310/0286* (2013.01); *G09G 2310/061* (2013.01)

(56) References Cited

U.S. PATENT DOCUMENTS

| | | | | |
|---|---|---|---|---|
| 2013/0169609 A1* | 7/2013 | Son | ........................ | G11C 19/28 345/209 |
| 2014/0098015 A1* | 4/2014 | Wang | .................... | G09G 3/3677 345/100 |
| 2014/0118237 A1* | 5/2014 | Wang | ..................... | G11C 19/28 345/100 |
| 2014/0169518 A1 | 6/2014 | Kong et al. | | |
| 2014/0192039 A1* | 7/2014 | Wang | ..................... | G11C 19/28 345/213 |
| 2015/0317954 A1* | 11/2015 | Jang | ........................ | G11C 19/28 345/213 |
| 2015/0325181 A1* | 11/2015 | Wang | .................... | G09G 3/3677 377/64 |
| 2016/0125955 A1* | 5/2016 | Pang | ..................... | G11C 19/287 377/64 |
| 2016/0275902 A1* | 9/2016 | Xue | ..................... | G09G 3/3266 |
| 2016/0293092 A1* | 10/2016 | Li | ......................... | G09G 3/2092 |
| 2017/0116945 A1 | 4/2017 | Cho et al. | | |
| 2017/0153742 A1* | 6/2017 | Pang | ..................... | G06F 3/0416 |
| 2017/0278473 A1 | 9/2017 | Shang et al. | | |
| 2018/0052652 A1* | 2/2018 | Kim | ........................ | G09G 5/001 |
| 2018/0122289 A1* | 5/2018 | Gu | ........................ | G09G 3/2092 |
| 2018/0190232 A1* | 7/2018 | Xue | ........................ | G09G 3/3677 |
| 2018/0218686 A1* | 8/2018 | Li | ........................... | G11C 19/28 |
| 2018/0261178 A1 | 9/2018 | Shao et al. | | |
| 2018/0286302 A1* | 10/2018 | Feng | ..................... | G11C 19/184 |
| 2018/0329547 A1* | 11/2018 | Wu | ......................... | G11C 19/28 |
| 2019/0095300 A1* | 3/2019 | Oba | ........................ | G05B 23/0281 |
| 2019/0385688 A1 | 12/2019 | Fu et al. | | |

FOREIGN PATENT DOCUMENTS

| | | |
|---|---|---|
| CN | 103065578 A | 4/2013 |
| CN | 105096902 A | 11/2015 |
| CN | 105741742 A | 7/2016 |
| CN | 106157874 A | 11/2016 |
| CN | 106847218 A | 6/2017 |
| CN | 106935172 A | 7/2017 |
| CN | 107564458 A | 1/2018 |

* cited by examiner

SHIFT REGISTER UNIT, DRIVING METHOD, GATE DRIVE CIRCUIT, AND DISPLAY DEVICE

This application claims priority to the Chinese Patent Application No. 201810212929.9, filed with the State Intellectual Property Office on Mar. 15, 2018 and titled "SHIFT REGISTER UNIT DRIVING METHOD, GATE DRIVE CIRCUIT AND DISPLAY DEVICE", the disclosure of which are incorporated herein by reference in its entirety.

TECHNICAL FIELD

The present disclosure relates to the field of display technology, and more particularly to a shift register unit, a driving method, a gate drive circuit, and a display device.

BACKGROUND

When displaying an image, a display device needs to use a gate driver on array (GOA) circuit to scan pixel units. The gate driver circuit (also referred to as shift register) includes a plurality of cascaded shift register units, each of which corresponds to a row of pixel units. The display device displays an image through scanning and driving a plurality of rows of pixel units in the display device row by row by the plurality of shift register units. Moreover, after the driving of the row of pixel units is completed, the shift register unit corresponding to the row of pixel units may reduce noise at the output terminal of the shift register unit under the control of a reset signal from a reset signal terminal, so as to ensure the stability of signals output from the output terminal.

SUMMARY

There are provided a shift register unit, a driving method, a gate drive circuit and a display device in the present disclosure.

According to a first aspect of the present disclosure, there is provided a shift register unit, comprising: an input sub-circuit, an output sub-circuit, a pull-down control sub-circuit, a pull-down sub-circuit, a first reset control sub-circuit and a reset sub-circuit;

wherein the input sub-circuit is connected respectively to an input signal terminal and a pull-up node, and configured to control an electric potential of the pull-up node under control of an input signal from the input signal terminal;

the output sub-circuit is connected respectively to a first clock signal terminal, the pull-up node and an output terminal, and configured to input a first clock signal from the first clock signal terminal to the output terminal under control of the pull-up node;

the pull-down control sub-circuit is connected respectively to a first power supply terminal, a second power supply terminal, the pull-up node and a pull-down node, and configured to control an electric potential of the pull-down node under control of the pull-up node, a first power supply signal from the first power supply terminal and a second power supply signal from the second power supply terminal;

the pull-down sub-circuit is connected respectively to the pull-up node, the pull-down node, the second power supply terminal and the output terminal, and configured to control electric potentials of the pull-up node and the output terminal under control of the pull-down node and the second power supply signal;

the first reset control sub-circuit is connected respectively to a first control node, a reset signal terminal, and a second control node, and configured to control an electric potential of the second control node under control of the first control node and a reset signal from the reset signal terminal; and the reset sub-circuit is connected respectively to the second control node, a third power supply terminal, and the pull-up node, and configured to control the electric potential of the pull-up node under control of the second control node and a third power supply signal from the third power supply terminal.

Optionally, the shift register unit further comprises: a second reset control sub-circuit; wherein the second reset control sub-circuit is connected respectively to a second clock signal terminal, a third clock signal terminal, the second power supply terminal, and the first control node, and configured to control an electric potential of the first control node under control of the second power supply signal, a second clock signal from the second clock signal terminal and a third clock signal from the third clock signal terminal.

Optionally, the second reset control sub-circuit comprises: a first transistor and a second transistor; wherein a gate electrode and a first electrode of the first transistor are connected to the third clock signal terminal, and a second electrode of the first transistor is connected to the first control node; and a gate electrode of the second transistor is connected to the second clock signal terminal, a first electrode of the second transistor is connected to the second power supply terminal, and a second electrode of the second transistor is connected to the first control node.

In addition, the electric potential of the first control node maintains an ineffective potential when the third clock signal having an effective potential is input to the first control node through the first transistor and the second power supply signal is input to the first control node through the second transistor.

Optionally, the first control node is further connected to a control clock signal terminal, and the control clock signal terminal is configured to output a control clock signal to control the electric potential of the first control node through the control clock signal.

Optionally, the first reset control sub-circuit comprises: a third transistor; wherein a gate electrode of the third transistor is connected to the first control node, a first electrode of the third transistor is connected to the reset signal terminal, and a second electrode of the third transistor is connected to the second control node.

Optionally, the reset sub-circuit comprises: a fourth transistor; wherein a gate electrode of the fourth transistor is connected to the second control node, a first electrode of the fourth transistor is connected to the third power supply terminal, and a second electrode of the fourth transistor is connected to the pull-up node.

Optionally, the output sub-circuit comprises: a fifth transistor; wherein a gate electrode of the fifth transistor is connected to the pull-up node, a first electrode of the fifth transistor is connected to the first clock signal terminal, and a second electrode of the fifth transistor is connected to the output terminal.

Optionally, the output sub-circuit further comprises: a capacitor; wherein a terminal of the capacitor is connected to the pull-up node, and the other terminal of the capacitor is connected to the output terminal.

Optionally, the input sub-circuit comprises: a sixth transistor; wherein a gate electrode and a first electrode of the sixth transistor are connected to the input signal terminal, and a second electrode of the sixth transistor is connected to the pull-up node.

Optionally, wherein the pull-down control sub-circuit comprises: a seventh transistor, an eighth transistor, a ninth transistor and a tenth transistor; wherein a gate electrode and a first electrode of the seventh transistor are connected to the first power supply terminal, and a second electrode of the seventh transistor is connected to a gate electrode of the eighth transistor; a first electrode of the eighth transistor is connected to the first power supply terminal, and a second electrode of the eighth transistor is connected to the pull-down node; a gate electrode of the ninth transistor is connected to the pull-up node, a first electrode of the ninth transistor is connected to the second power supply terminal, and a second electrode of the ninth transistor is connected to the gate electrode of the eighth transistor; and a gate electrode of the tenth transistor is connected to the pull-up node, a first electrode of the tenth transistor is connected to the second power supply terminal, and a second electrode of the tenth transistor is connected to pull-down node.

Optionally, the pull-down control sub-circuit further comprises: an eleventh transistor; wherein a gate electrode and a first electrode of the eleventh transistor are connected to a global reset signal terminal, and a second electrode of the eleventh transistor is connected to the pull-down node.

Optionally, the pull-down sub-circuit comprises: a twelfth transistor and a thirteenth transistor; wherein a gate electrode of the twelfth transistor is connected to the pull-down node, a first electrode of the twelfth transistor is connected to the second power supply terminal, and a second electrode of the twelfth transistor is connected to the pull-up node; and a gate electrode of the thirteenth transistor is connected to the pull-down node, a first electrode of the thirteenth transistor is connected to the second power supply terminal, and a second electrode of the thirteenth transistor is connected to the output terminal.

Optionally, the shift register unit further comprises: a first transistor, a second transistor, a third transistor, a fourth transistor, a fifth transistor, a capacitor, a sixth transistor, a seventh transistor, an eighth transistor, a ninth transistor and a tenth transistor, an eleventh transistor, a twelfth transistor and a thirteenth transistor;

wherein a gate electrode and a first electrode of the first transistor are connected to a third clock signal terminal, and a second electrode of the first transistor is connected to the first control node;

a gate electrode of the second transistor is connected to the second clock signal terminal, a first electrode of the second transistor is connected to the second power supply terminal, and a second electrode of the second transistor is connected to the first control node;

a gate electrode of the third transistor is connected to the first control node, a first electrode of the third transistor is connected to the reset signal terminal, and a second electrode of the third transistor is connected to the second control node;

a gate electrode of the fourth transistor is connected to the second control node, a first electrode of the fourth transistor is connected to the third power supply terminal, and a second electrode of the fourth transistor is connected to the pull-up node;

a gate electrode of the fifth transistor is connected to the pull-up node, a first electrode of the fifth transistor is connected to the first clock signal terminal, and a second electrode of the fifth transistor is connected to the output terminal;

a terminal of the capacitor is connected to the pull-up node, and the other terminal of the capacitor is connected to the output terminal;

a gate electrode and a first electrode of the sixth transistor are connected to the input signal terminal, and a second electrode of the sixth transistor is connected to the pull-up node;

a gate electrode and a first electrode of the seventh transistor are connected to the first power supply terminal, and a second electrode of the seventh transistor is connected to a gate electrode of the eighth transistor;

a first electrode of the eighth transistor is connected to the first power supply terminal, and a second electrode of the eighth transistor is connected to the pull-down node;

a gate electrode of the ninth transistor is connected to the pull-up node, a first electrode of the ninth transistor is connected to the second power supply terminal, and a second electrode of the ninth transistor is connected to the gate electrode of the eighth transistor;

a gate electrode of the tenth transistor is connected to the pull-up node, a first electrode of the tenth transistor is connected to the second power supply terminal, and a second electrode of the tenth transistor is connected to pull-down node;

a gate electrode and a first electrode of the eleventh transistor are connected to a global reset signal terminal, and a second electrode of the eleventh transistor is connected to the pull-down node;

a gate electrode of the twelfth transistor is connected to the pull-down node, a first electrode of the twelfth transistor is connected to the second power supply terminal, and a second electrode of the twelfth transistor is connected to the pull-up node; and a gate electrode of the thirteenth transistor is connected to the pull-down node, a first electrode of the thirteenth transistor is connected to the second power supply terminal, and a second electrode of the thirteenth transistor is connected to the output terminal.

Optionally, the shift register unit further comprises: a third transistor, a fourth transistor, a fifth transistor, a capacitor, a sixth transistor, a seventh transistor, an eighth transistor, a ninth transistor and a tenth transistor, an eleventh transistor, a twelfth transistor and a thirteenth transistor;

wherein a gate electrode of the third transistor is connected to the first control node, a first electrode of the third transistor is connected to the reset signal terminal, and a second electrode of the third transistor is connected to the second control node;

a gate electrode of the fourth transistor is connected to the second control node, a first electrode of the fourth transistor is connected to the third power supply terminal, and a second electrode of the fourth transistor is connected to the pull-up node;

a gate electrode of the fifth transistor is connected to the pull-up node, a first electrode of the fifth transistor is connected to the first clock signal terminal, and a second electrode of the fifth transistor is connected to the output terminal;

a terminal of the capacitor is connected to the pull-up node, and the other terminal of the capacitor is connected to the output terminal;

a gate electrode and a first electrode of the sixth transistor are connected to the input signal terminal, and a second electrode of the sixth transistor is connected to the pull-up node;

a gate electrode and a first electrode of the seventh transistor are connected to the first power supply terminal, and a second electrode of the seventh transistor is connected to a gate electrode of the eighth transistor;

a first electrode of the eighth transistor is connected to the first power supply terminal, and a second electrode of the eighth transistor is connected to the pull-down node;

a gate electrode of the ninth transistor is connected to the pull-up node, a first electrode of the ninth transistor is connected to the second power supply terminal, and a second electrode of the ninth transistor is connected to the gate electrode of the eighth transistor;

a gate electrode of the tenth transistor is connected to the pull-up node, a first electrode of the tenth transistor is connected to the second power supply terminal, and a second electrode of the tenth transistor is connected to pull-down node;

a gate electrode and a first electrode of the eleventh transistor are connected to a global reset signal terminal, and a second electrode of the eleventh transistor is connected to the pull-down node;

a gate electrode of the twelfth transistor is connected to the pull-down node, a first electrode of the twelfth transistor is connected to the second power supply terminal, and a second electrode of the twelfth transistor is connected to the pull-up node;

a gate electrode of the thirteenth transistor is connected to the pull-down node, a first electrode of the thirteenth transistor is connected to the second power supply terminal, and a second electrode of the thirteenth transistor is connected to the output terminal; and the first control node is further connected to a control clock signal terminal, and the control clock signal terminal is configured to output a control clock signal to control the electric potential of the first control node through the control clock signal.

According to a second aspect of the present disclosure, there is provided a driving method of a shift register unit for driving the shift register unit comprising: an input sub-circuit, an output sub-circuit, a pull-down control sub-circuit, a pull-down sub-circuit, a first reset control sub-circuit and a reset sub-circuit, and the method comprising:

controlling, by the input sub-circuit, an electric potential of a pull-up node to be an effective potential under control of the input signal during a charging stage in which an electric potential of an input signal output by an input signal terminal is an effective potential;

inputting, by the output sub-circuit, the first clock signal having an effective potential to the output terminal under control of the pull-up node during an outputting stage in which an electric potential of a first clock signal output by a first clock signal terminal is an effective potential, and the electric potential of the pull-up node maintains an effective potential;

controlling, by the first reset control sub-circuit, an electric potential of a second control node to be an ineffective potential under control of the first control node and the reset signal and controlling, by the reset sub-circuit, the electric potential of the pull-up node to maintain an effective potential under control of the second control node during a noise pre-reducing stage in which an electric potential of a reset signal output by a reset signal terminal is an effective potential, an electric potential of a first control node is an ineffective potential; and inputting, by the output sub-circuit, the first clock signal having an ineffective potential to the output terminal under control of the pull-up node during the noise pre-reducing stage in which the electric potential of the first clock signal is an ineffective potential; and controlling, by the first reset control sub-circuit, the electric potential of the second control node to be an effective potential under control of the first control node and the reset signal, and controlling, by the reset sub-circuit, the electric potential of the pull-up node to be an ineffective potential under control of the second control node and a third power supply signal having an ineffective potential during a noise reducing stage in which the electric potential of the reset signal is an effective potential and the electric potential of the first control node is an effective potential; controlling, by the pull-down control sub-circuit, the electric potential of the pull-down node to be an effective potential under control of the first power supply signal, the second power supply signal and the pull-up node during the noise reducing stage in which an electric potential of a first power supply signal output by a first power supply terminal is an effective potential and an electric potential of a second power supply signal output by a second power supply terminal is an ineffective potential; and controlling, by the pull-down sub-circuit, the electric potentials of the pull-up node and the output terminal to be ineffective potentials under control of the pull-down node and the second power supply signal.

Optionally, the method further comprises: inputting, by the pull-down control sub-circuit, the global reset signal having an effective potential to the pull-down node under control of the global reset signal during a global reset stage in which an electric potential of a global reset signal output by a global reset signal terminal is an effective potential.

According to a third aspect of the present disclosure, there is provided a gate drive circuit, comprising a plurality of cascaded shift register units, wherein the shift register unit comprises: an input sub-circuit, an output sub-circuit, a pull-down control sub-circuit, a pull-down sub-circuit, a first reset control sub-circuit and a reset sub-circuit;

wherein the input sub-circuit is connected respectively to an input signal terminal and a pull-up node, and configured to control an electric potential of the pull-up node under control of an input signal from the input signal terminal;

the output sub-circuit is connected respectively to a first clock signal terminal, the pull-up node and an output terminal, and configured to input a first clock signal from the first clock signal terminal to the output terminal under the control of the pull-up node;

the pull-down control sub-circuit is connected respectively to a first power supply terminal, a second power supply terminal, the pull-up node and a pull-down node, and configured to control an electric potential of the pull-down node under the control of the pull-up node, a first power supply signal from the first power supply terminal and a second power supply signal from the second power supply terminal;

the pull-down sub-circuit is connected respectively to the pull-up node, the pull-down node, the second power supply terminal, and the output terminal, and configured to control electric potentials of the pull-up node and the output terminal under the control of the pull-down node and the second power supply signal;

the first reset control sub-circuit is connected respectively to a first control node, a reset signal terminal, and a second control node, and configured to control an electric potential of the second control node under the control of the first control node and a reset signal from the reset signal terminal; and the reset sub-circuit is connected respectively to the second control node, a third power supply terminal, and the pull-up node, and configured to control the electric potential of the pull-up node under the control of the second control node and a third power supply signal from the third power supply terminal.

Optionally, each of the plurality of cascaded shift register units comprises: a second reset control sub-circuit connected respectively to a second clock signal terminal, a third clock signal terminal, a second power supply terminal and the first control node, an output terminal of the $(j+2)^{th}$ shift register unit is connected to a reset signal terminal of the $j^{th}$ shift register unit, a first clock signal terminal of the $(j+1)^{th}$ shift register unit is connected to a second clock signal terminal of the $j^{th}$ shift register unit, and a second clock signal terminal of the $(j+1)^{th}$ shift register unit is connected to a third clock signal terminal of the $j^{th}$ shift register unit, j being an positive integer.

Optionally, the first control node of each of the plurality of cascaded shift register units is connected to a control clock signal terminal, and an output terminal of the $(j+1)^{th}$ shift register unit is connected to the reset signal terminal of the $j^{th}$ shift register unit, j being an positive integer.

According to a fourth aspect of the present disclosure, there is provided a display device, comprising the gate drive circuit described in the third aspect.

DETAILED DESCRIPTION

The embodiments of the present disclosure will be described in further detail with reference to the enclosed drawings, to make the principles and advantages of the present disclosure clearer.

Transistors used in all embodiments of the present disclosure may be thin film transistors, field-effect transistors or others devices having the same property. According to the function of transistors in the circuit, the transistors used in the embodiments of the present disclosure are mainly switch transistors. Since the source electrode and drain electrode of the switch transistor herein are symmetrical, the source electrode and drain electrode may be interchangeable. In the embodiments of the present disclosure, the source electrode of a transistor is referred to as a first electrode, and the drain electrode is referred to as a second electrode. According to the form in the enclosed drawings, the intermediate terminal of a transistor is a gate electrode, the signal input terminal is a source electrode, and the signal output terminal is a drain electrode. In addition, transistors in the embodiments of the present disclosure may include P-type switch transistors and N-type switch transistors. Herein, the P-type switch transistor is turned on when the gate electrode has a low electric potential and turned off when the electrode has a high electric potential. The N-type switch transistor is turned on when the gate electrode has a high electric potential and turned off when the electrode has a low electric potential. Moreover, a plurality of signals in the embodiments of the present disclosure have high electric potentials or low electric potentials, and an effective potential of the signal refers to a potential enabling the switch transistor to be turned on. For example, as for the P-type switch transistor, the low electric potential is an effective potential, and for the N-type switch transistor, the high electric potential is an effective potential.

In the related art, an output sub-circuit and a pull-down sub-circuit are usually arranged in a shift register unit. The output sub-circuit is configured to output a drive signal under the control of a pull-up node, and the pull-down sub-circuit is configured to reduce noise for the output terminal under the control of the pull-up node.

However, as the transistor included in the pull-down sub-circuit has a limited driving capacity, the noise reduction efficiency of the pull-down sub-circuit is low.

Figure 1:
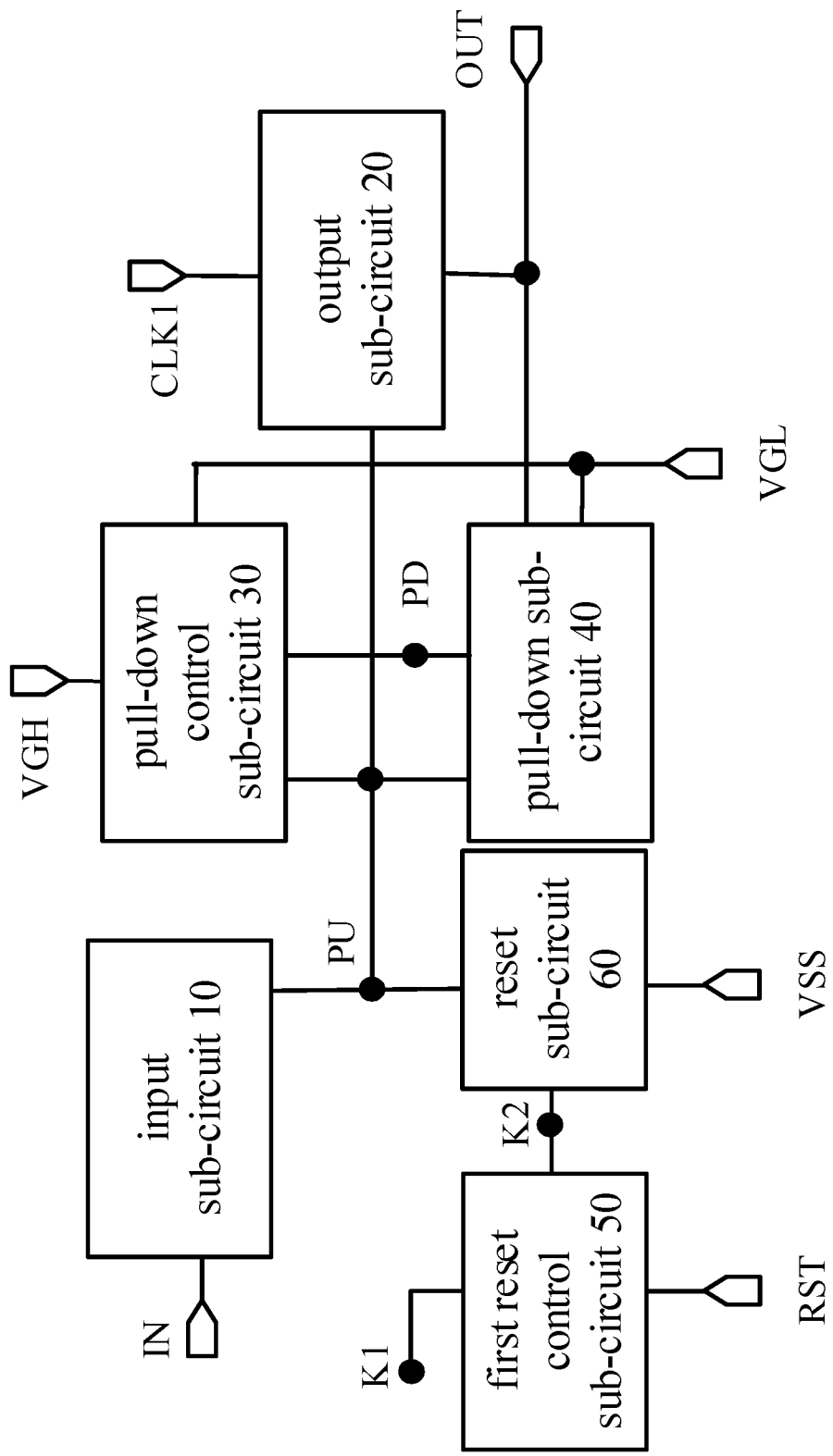
FIG. 1 is a schematic diagram of a structure of a shift register unit according to an embodiment of the present disclosure.

FIG. 1 is a schematic diagram of a structure of a shift register unit according to an embodiment of the present disclosure. Referring to FIG. 1, the shift register unit may include: an input sub-circuit 10, an output sub-circuit 20, a pull-down control sub-circuit 30, a pull-down sub-circuit 40, a first reset control sub-circuit 50 and a reset sub-circuit 60.

The input sub-circuit 10 is connected respectively to an input signal terminal IN and a pull-up node PU, and configured to control an electric potential of the pull-up node PU under the control of an input signal from the input signal terminal IN. For example, the input sub-circuit 10 is configured to control the electric potential of the pull-up node PU to be an effective potential when the electric potential of the input signal is an effective potential.

The output sub-circuit 20 is connected respectively to a first clock signal terminal CLK1, the pull-up node PU and an output terminal OUT, and configured to input a first clock signal from the first clock signal terminal CLK1 to the output terminal OUT under the control of the pull-up node PU. For example, the output sub-circuit 20 is configured to input a clock signal from the first clock signal terminal CLK1 to the output terminal OUT when the electric potential of the pull-up node PU is an effective potential.

The pull-down control sub-circuit 30 is connected respectively to a first power supply terminal VGH, a second power supply terminal VGL, the pull-up node PU and a pull-down node PD, and configured to control the electric potential of the pull-down node PD under the control of the pull-up node PU, a first power supply signal from the first power supply terminal VGH and a second power supply signal from the second power supply terminal VGL. For example, the pull-down control sub-circuit 30 is configured to control the electric potential of the pull-down node PD to be an ineffective potential when the electric potential of the pull-up node PU is an effective potential, the electric potential of the first power supply signal is an effective potential and the electric potential of the second power supply signal is an ineffective potential. Alternatively, the pull-down control sub-circuit 30 is configured to control the electric potential of the pull-down node PD to be an effective potential when the electric potential of the pull-up node PU is an ineffective potential and the electric potential of the first power supply signal is an effective potential.

The pull-down sub-circuit 40 is connected respectively to the pull-up node PU, the pull-down node PD, the second power supply terminal VGL, and the output terminal OUT, and configured to control the electric potentials of the pull-up node PU and the output terminal OUT under the control of the pull-down node PD and the second power supply signal. For example, the pull-down sub-circuit 40 is configured to control the electric potential of the pull-up node PU and the electric potential of the output terminal OUT respectively to be an ineffective potential when the electric potential of the pull-down node PD is an effective potential and the electric potential of the second power supply signal is an ineffective potential.

The first reset control sub-circuit 50 is connected respectively to a first control node K1, a reset signal terminal RST, and a second control node K2, and configured to control the electric potential of the second control node K2 under the control of the first control node K1 and a reset signal from the reset signal terminal RST. For example, the first reset control sub-circuit 50 is configured to control the electric potential of the second control node K2 to be an ineffective potential when the electric potential of the first control node K1 is an ineffective potential and the electric potential of the reset signal from the reset signal terminal RST is an effective potential. Alternatively, the first reset control sub-circuit 50 is configured to control the electric potential of the second control node K2 to be an effective potential when the electric potential of the first control node K1 is an effective potential and the electric potential of the reset signal is an effective potential.

The reset sub-circuit 60 is connected respectively to the second control node K2, a third power supply terminal VSS, and the pull-up node PU, and configured to control the electric potential of the pull-up node PU under the control of the second control node K2 and a third power supply signal from the third power supply terminal VSS. For example, the reset sub-circuit 60 is configured to control the electric potential of the pull-up node to be an ineffective potential when the electric potential of the second control node K2 is an effective potential and the electric potential of the third power supply signal is an ineffective potential.

Herein, all of the first power supply terminal, the second power supply terminal and the third power supply terminal may be DC power supply terminals, which is not limited in the embodiments of the present disclosure.

In summary, the shift register unit provided in the embodiments of the present disclosure includes a first reset control sub-circuit, a reset sub-circuit and an output sub-circuit. The first reset control sub-circuit controls the electric potential of the second control node under the control of the electric potential of the first control node and the reset signal. The reset sub-circuit controls the electric potential of the pull-up node according to the electric potential of the second control node, to enable the electric potential of the pull-up node to maintain an effective potential after the output stage, such that the output sub-circuit reduces the noise at the output terminal under the control of the pull-up node having an effective potential. Moreover, as the output sub-circuit has a great driving capability, the noise at the output terminal may be reduced faster through the output sub-circuit, thereby improving the noise reduction efficiency at the output terminal.

Additionally, the electric potential of the first control node K1 may be controlled through at least the following two implementations.

Figure 2:
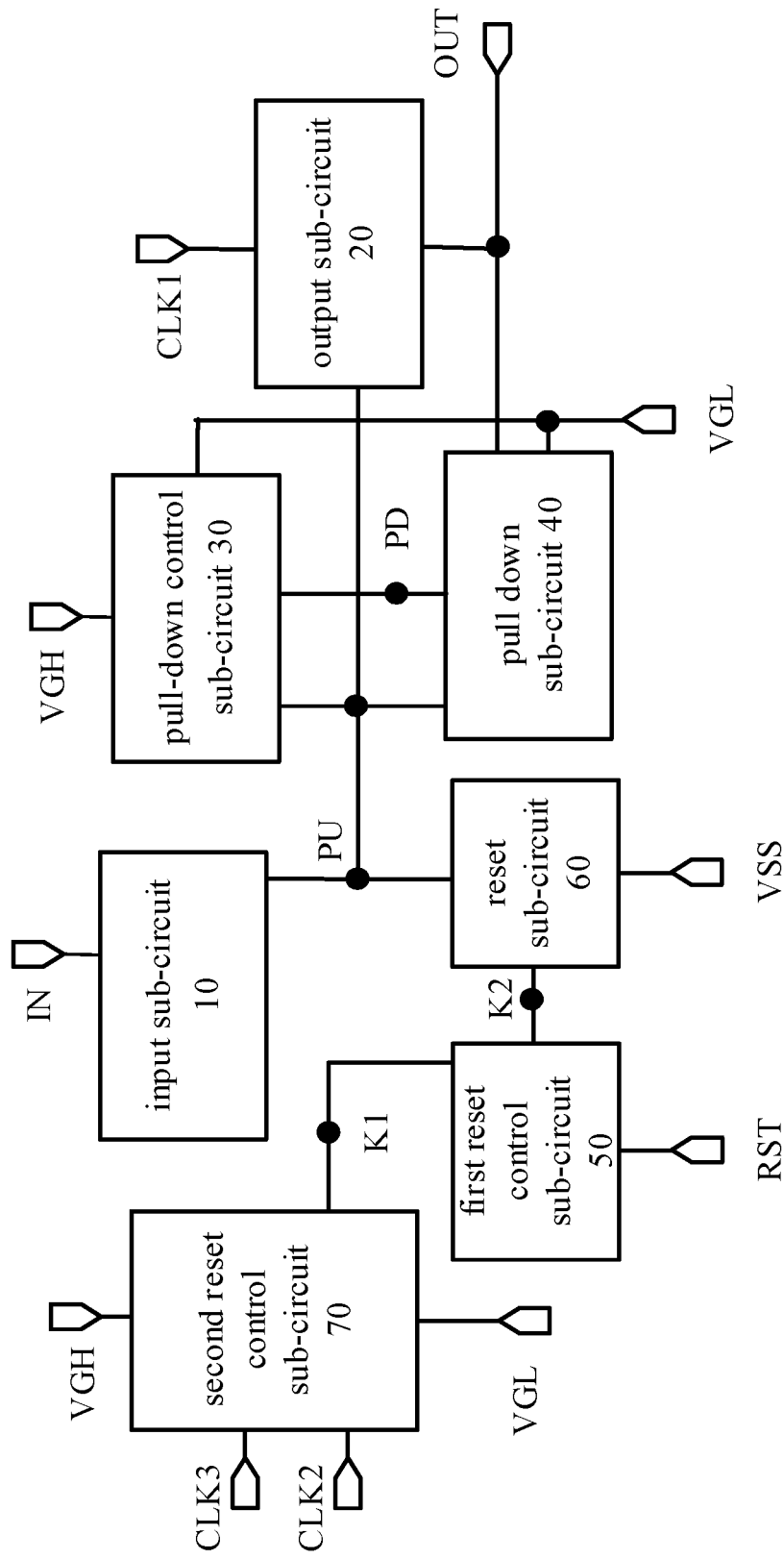
FIG. 2 is a schematic diagram of a structure of another shift register unit according to an embodiment of the present disclosure.

As shown in FIG. 2, in a first implementation, the shift register unit may include: a second reset control sub-circuit 70. The second reset control sub-circuit 70 may be connected in many ways, and the following two ways are taken as examples for illustration in the embodiments of the present disclosure.

In a first way, the second reset control sub-circuit 70 is connected respectively to a second clock signal terminal CLK2, a third clock signal terminal CLK3, a first power supply terminal VGH, the second power supply terminal VGL, and the first control node K1. The second reset control sub-circuit 70 is configured to control the electric potential of the first control node K1 under the control of the first power supply signal, the second power supply signal, the second clock signal from the second clock signal terminal CLK2 and the third clock signal from the third clock signal terminal CLK3. For example, the second reset control sub-circuit 70 is configured to control the electric potential of the first control node K1 to be an ineffective potential when the electric potential of the first power supply signal is an effective potential, the electric potential of the second power supply signal is an ineffective potential, and the electric potentials of both the second clock signal and the third clock signal are effective potentials. Alternatively, the second reset control sub-circuit 70 is configured to control the electric potential of the first control node K1 to be an ineffective potential when the electric potential of the first power supply signal is an effective potential, the electric potential of the second power supply signal is an ineffective potential, the electric potential of the second clock signal is an effective potential, and the electric potential of the third clock signal is an ineffective potential. Alternatively, the second reset control sub-circuit 70 is configured to control the electric potential of the first control node K1 to be an effective potential when the electric potential of the first power supply signal is an effective potential, the electric potential of the second power supply signal is an ineffective potential, the electric potential of the second clock signal is an ineffective potential, and the electric potential of the third clock signal is an effective potential.

In a second way, the second reset control sub-circuit 70 is connected respectively to a second clock signal terminal CLK2, a third clock signal terminal CLK3, the second power supply terminal VGL, and the first control node K1. The second reset control sub-circuit 70 is configured to control the electric potential of the first control node K1 under the control of the second power supply signal, the second clock signal from the second clock signal terminal CLK2 and the third clock signal from the third clock signal terminal CLK3. In this way, the control function of the second reset control sub-circuit 70 on the electric potential of the first control node K1 may be referred to the control function of the second reset control sub-circuit 70 in the first way, which is not repeated here.

Figure 3:
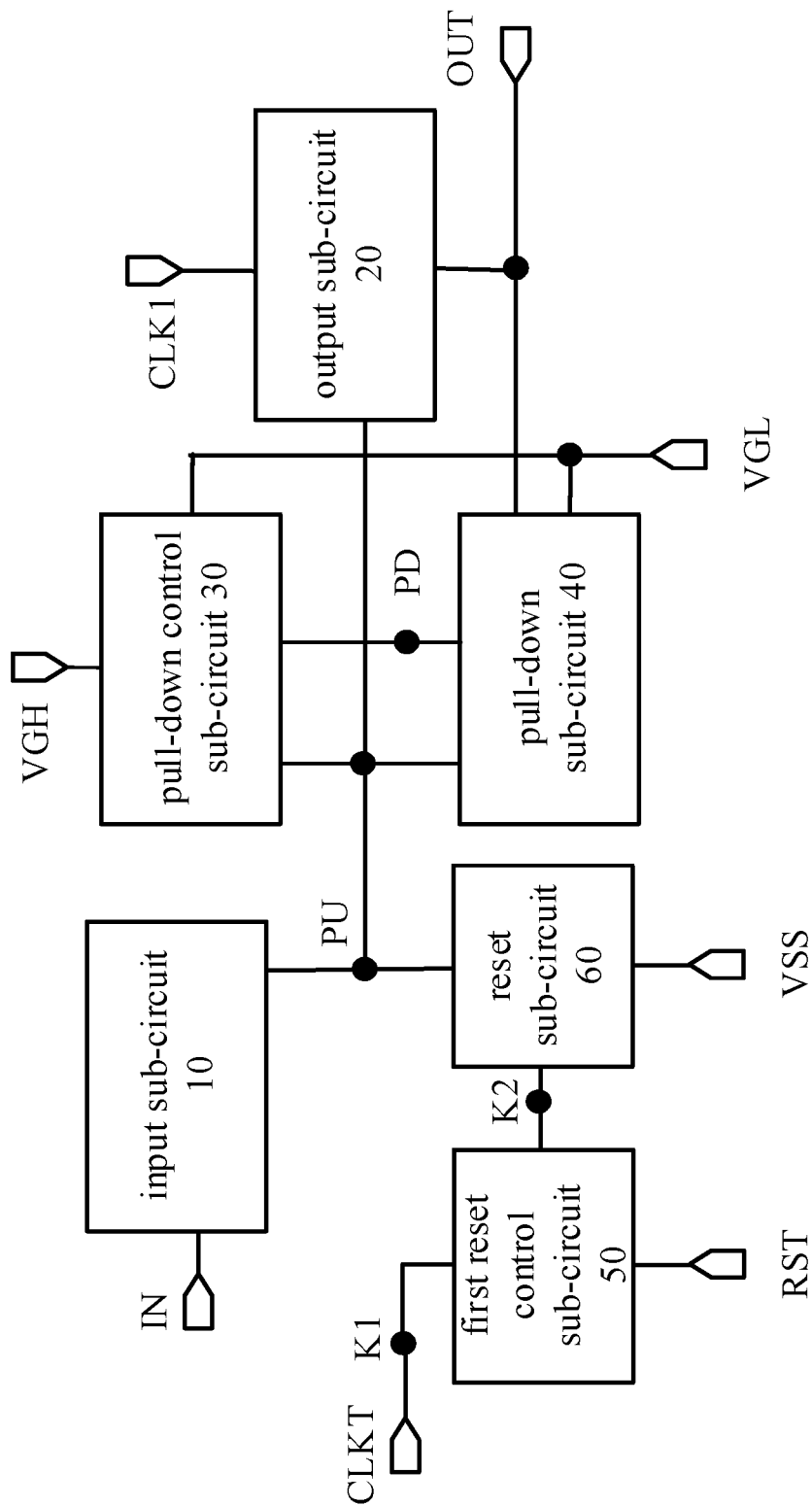
FIG. 3 is a schematic diagram of a structure of another shift register unit according to an embodiment of the present disclosure.

Referring to FIG. 3, in another implementation, the first control node K1 is connected to a control clock signal terminal CLKT, and the control clock signal terminal CLKT is configured to output a control clock signal and control the electric potential of the first control node K1 through the control clock signal. For example, the electric potential of the first control node K1 may be controlled to be an effective potential when the electric potential of the control clock signal is an effective potential, and the electric potential of the first control node K1 may be controlled to be an ineffective potential when the electric potential of the control clock signal is an ineffective potential.

Figure 4:
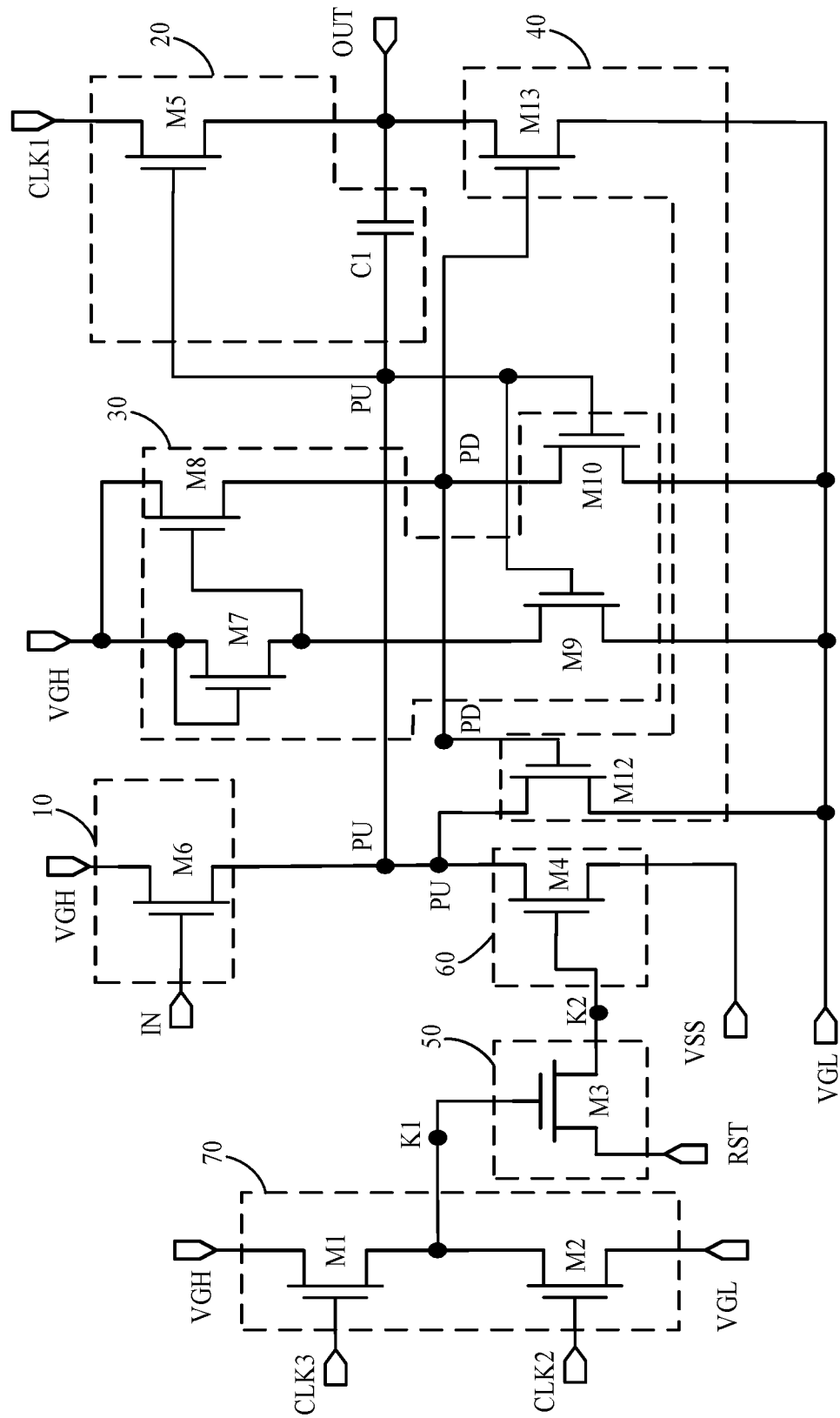
FIG. 4 is a schematic diagram of a structure of yet another shift register unit according to an embodiment of the present disclosure.

Furthermore, please refer to FIG. 4, the second reset control sub-circuit 70 may include: a first transistor M1 and a second transistor M2.

A gate electrode of the first transistor M1 is connected to the third clock signal terminal CLK3, a first electrode of the first transistor M1 is connected to the first power supply terminal VGH, and a second electrode of the first transistor M1 is connected to the first control node K1. Alternatively, both the gate electrode and the first electrode of the first transistor M1 are connected to the third clock signal terminal CLK3, and the second electrode of the first transistor is connected to the first control node K1.

A gate electrode of the second transistor M2 is connected to the second clock signal terminal CLK2, a first electrode of the second transistor M2 is connected to the second power supply terminal VGL, and a second electrode of the second transistor M2 is connected to the first control node K1.

Here, when the third clock signal having an effective potential is input to the first control node K1 through the first transistor M1, and the second power supply signal is input to the first control node K1 through the second transistor M2, the electric potential of the first control node K1 may maintain an ineffective potential. The implementation of maintaining the electric potential of the first control node K1 to be an ineffective potential may include: designing the length-width ratio of the channel of the first transistor M1 and the length-width ratio of the channel of the second transistor M2 during the circuit design. For example, the ratio of the length-width ratio of the channel of the first transistor M1 to the length-width ratio of the channel of the second transistor M2 may be 1:5 or 1:6.

Figure 5:
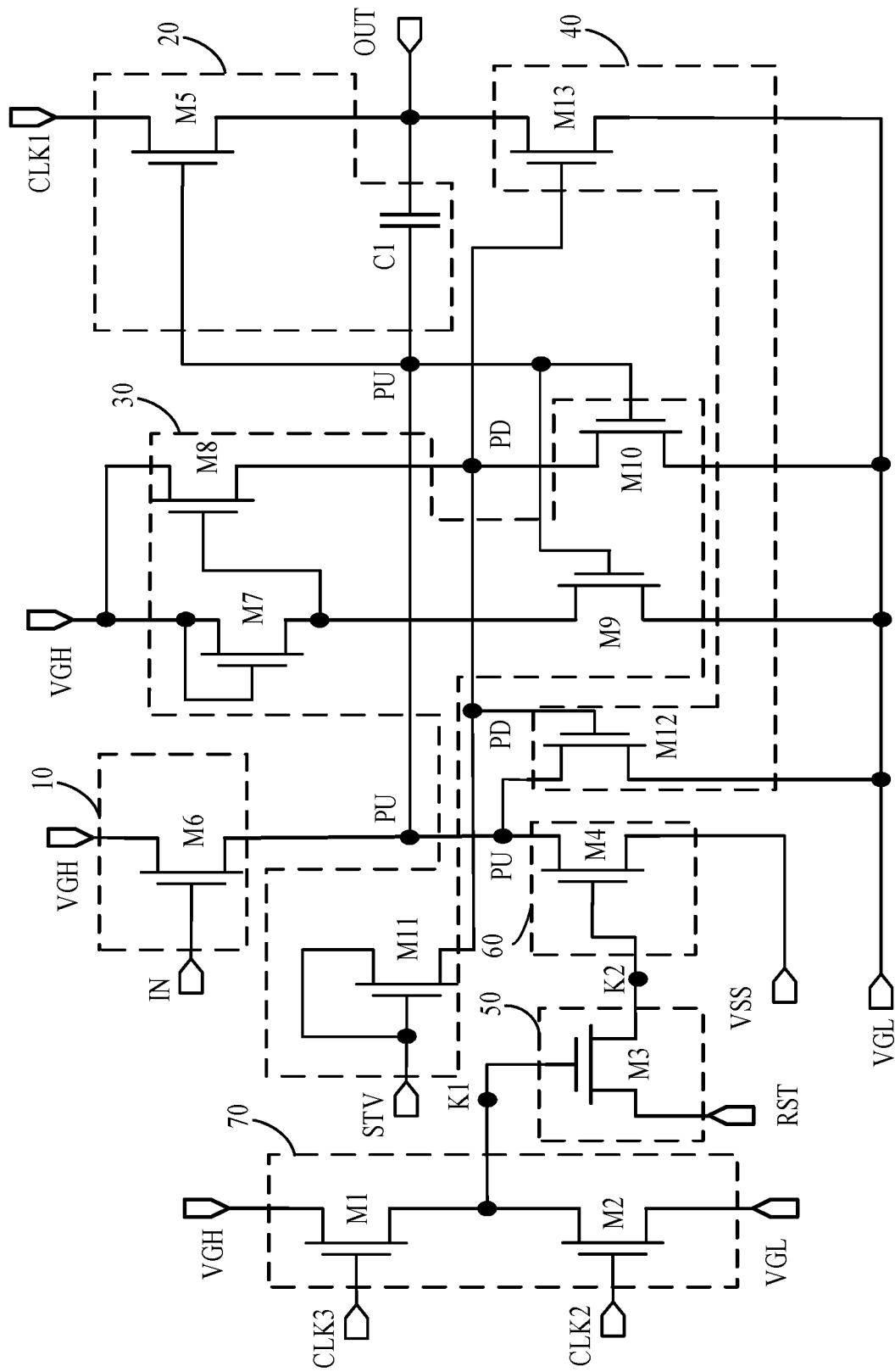
FIG. 5 is a schematic diagram of a structure of still yet another shift register unit according to an embodiment of the present disclosure.
Figure 6:
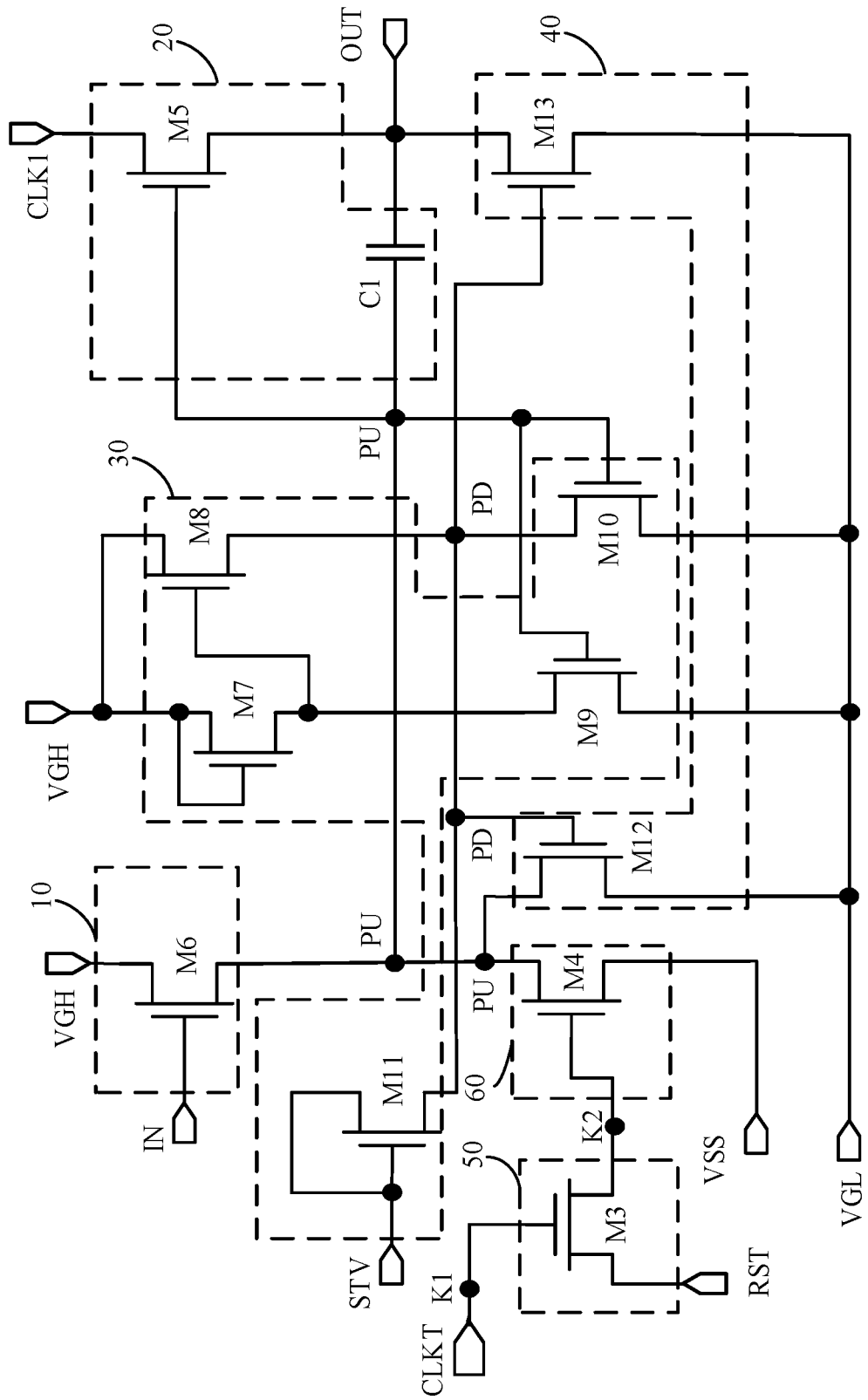
FIG. 6 is a schematic diagram of a structure of still yet another shift register unit according to an embodiment of the present disclosure.

Please refer to FIG. 4, FIG. 5 and FIG. 6, the first reset control sub-circuit 50 may include a third transistor M3. A gate electrode of the third transistor M3 is connected to the first control node K1, a first electrode of the third transistor M3 is connected to the reset signal terminal RST, and a second electrode of the third transistor M3 is connected to the second control node K2.

Please refer to FIG. 4, FIG. 5 and FIG. 6, the reset sub-circuit 60 may include: a fourth transistor M4. A gate electrode of the fourth transistor M4 is connected to the second control node K2, a first electrode of the fourth transistor M4 is connected to the third power supply terminal VS S, and a second electrode of the fourth transistor M4 is connected to the pull-up node PU.

Please refer to FIG. 4, FIG. 5 and FIG. 6, the output sub-circuit 20 may include: a fifth transistor M5 and a capacitor C1.

A gate electrode of the fifth transistor M5 is connected to the pull-up node PU, a first electrode of the fifth transistor M5 is connected to the first clock signal terminal CLK1, and a second electrode of the fifth transistor M5 is connected to the output terminal OUT.

A terminal of the capacitor C1 is connected to the pull-up node, and the other terminal of the capacitor C1 is connected to the output terminal OUT.

Please refer to FIG. 4, FIG. 5 and FIG. 6, the input sub-circuit 10 may include: a sixth transistor M6. A gate electrode and a first electrode of the sixth transistor M6 may be connected to the input signal terminal IN (not shown in FIG. 4, FIG. 5 and FIG. 6), and a second electrode of the sixth transistor M6 is connected to the pull-up node PU. Alternatively, the input sub-circuit 10 may further be connected to the first power supply terminal VGH. The gate electrode of the sixth transistor M6 may be connected to the input signal terminal IN, the first electrode of the sixth transistor M6 may be connected to the first power supply terminal VGH, and the second electrode of the sixth transistor M6 is connected to the pull-up node PU.

Optionally, please refer to FIG. 4, FIG. 5 and FIG. 6, the pull-down control sub-circuit 30 may include: a seventh transistor M7, an eighth transistor M8, a ninth transistor M9 and a tenth transistor M10.

Both a gate electrode and a first electrode of the seventh transistor M7 are connected to the first power supply terminal VGH, and a second electrode of the seventh transistor M7 is connected to a gate electrode of the eighth transistor M8.

A first electrode of the eighth transistor M8 is connected to the first power supply terminal VGH, and a second electrode of the eighth transistor M8 is connected to the pull-down node PD.

A gate electrode of the ninth transistor M9 is connected to the pull-up node PU, a first electrode of the ninth transistor M9 is connected to the second power supply terminal VGL, and a second electrode of the ninth transistor M9 is connected to the gate electrode of the eighth transistor M8.

A gate electrode of the tenth transistor M10 is connected to the pull-up node PU, a first electrode of the tenth transistor M10 is connected to the second power supply terminal VGL, and a second electrode of the tenth transistor M10 is connected to pull-down node PD.

Optionally, please refer to FIG. 5 and FIG. 6, the pull-down control sub-circuit 30 may further include: an eleventh transistor M11. Both a gate electrode and a first electrode of the eleventh transistor M11 are connected to a global reset signal terminal STV, and a second electrode of the eleventh transistor M11 is connected to the pull-down node PD.

Optionally, please refer to FIG. 4, FIG. 5 and FIG. 6, the pull-down sub-circuit 40 may include: a twelfth transistor M12 and a thirteenth transistor M13.

A gate electrode of the twelfth transistor M12 is connected to the pull-down node PD, a first electrode of the twelfth transistor M12 is connected to the second power supply terminal VGL, and a second electrode of the twelfth transistor M12 is connected to the pull-up node PU.

A gate electrode of the thirteenth transistor M13 is connected to the pull-down node PD, a first electrode of the thirteenth transistor M13 is connected to the second power supply terminal VGL, and a second electrode of the thirteenth transistor M13 is connected to the output terminal OUT.

In summary, the shift register unit provided in the embodiments of the present disclosure includes a first reset control sub-circuit, a reset sub-circuit and an output sub-circuit. The first reset control sub-circuit controls the electric potential of the second control node under the control of the electric potential of the first control node and the reset signal. The reset sub-circuit controls the electric potential of the pull-up node according to the electric potential of the second control node, to enable the electric potential of the pull-up node to maintain an effective potential after the output stage, such that the output sub-circuit reduces noise at the output terminal under the control of the pull-up node having an effective potential. Moreover, as the output sub-circuit has a great driving capability, the noise at the output terminal may be reduced faster through the drive of output sub-circuit, thereby improving the noise reduction efficiency at the output terminal. Furthermore, the duration during which the electric potential of first control node maintains an effective potential may be adjusted based on actual demands, so as to adjust the duration of reducing noise at the output terminal through the output sub-circuit and the pull-down sub-circuit, thereby realizing the free allocation of duration between the two sub-circuits.

Figure 7:
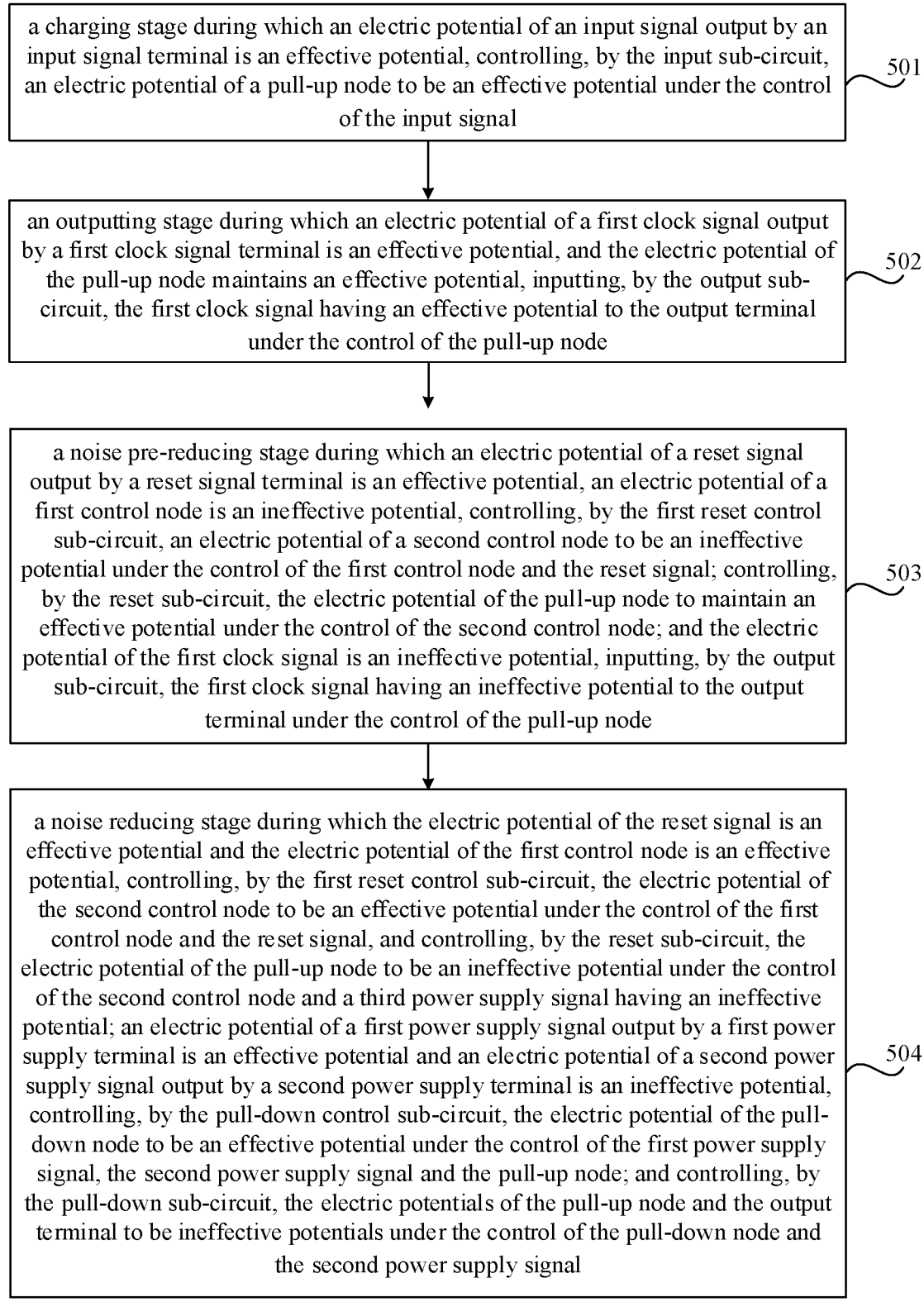
FIG. 7 is a flow chart of a method for driving a shift register unit according to an embodiment of the present disclosure.

FIG. 7 is a flow chart of a method for driving a shift register unit according to an embodiment of the present disclosure. The method may be used to drive the shift register unit shown in any one of FIG. 1 to FIG. 6. As shown in FIG. 7, the method may include the following operating steps.

In step 501, during a charging stage, an electric potential of an input signal output by an input signal terminal is an effective potential, the input sub-circuit controls the electric potential of the pull-up node to be an effective potential under the control of the input signal.

In step 502, during an outputting stage, an electric potential of a first clock signal output by a first clock signal terminal is an effective potential, and the electric potential of the pull-up node maintains an effective potential, the output sub-circuit inputs the first clock signal having an effective potential to the output terminal under the control of the pull-up node.

In step 503, during a noise pre-reducing stage, an electric potential of a reset signal output by a reset signal terminal is an effective potential, an electric potential of a first control node is an ineffective potential, the first reset control sub-circuit controls an electric potential of a second control node to be an ineffective potential under the control of the first control node and the reset signal. The reset sub-circuit controls the electric potential of the pull-up node to maintain an effective potential under the control of the second control node. The electric potential of the first clock signal is an ineffective potential, and the output sub-circuit inputs the first clock signal having an ineffective potential to the output terminal under the control of the pull-up node.

In step 504, during a noise reducing stage, the electric potential of the reset signal is an effective potential and the electric potential of the first control node is an effective potential, and the first reset control sub-circuit controls the electric potential of the second control node to be an effective potential under the control of the first control node and the reset signal. The reset sub-circuit controls the electric potential of the pull-up node to be an ineffective potential under the control of the second control node and a third power supply signal having an ineffective potential. An electric potential of a first power supply signal output by a first power supply terminal is an effective potential and an electric potential of a second power supply signal output by a second power supply terminal is an ineffective potential, and the pull-down control sub-circuit controls the electric potential of the pull-down node to be an effective potential under the control of the first power supply signal, the second power supply signal and the pull-up node. The pull-down sub-circuit controls the electric potentials of the pull-up node and the output terminal to be ineffective potentials under the control of the second power supply signal and the pull-down node.

Optionally, the driving method may further include a global reset stage. During the global reset stage, an electric potential of a global reset signal output by a global reset signal terminal is an effective potential, and the pull-down control sub-circuit inputs the global reset signal having an effective potential to the pull-down node under the control of the global reset signal. The pull-down control sub-circuit is configured to adjust the electric potential of the pull-down node to be an effective potential before the display of each frame of image, so as to reset the pull-up node and the output terminal corresponding to each row of pixels, thereby avoiding damage to the display panel caused by residual charges.

The structure of the shift register unit shown in FIG. 5 is taken as an example to illustrate the driving process during the global reset stage. When the electric potential of the global reset signal output by the global reset signal terminal STV is an effective potential, the eleventh transistor M11 is turned on under the control of the global reset signal and the global reset signal terminal STV inputs the global reset signal having an effective potential to the pull-down node PD through the eleventh transistor M11, such that the electric potential of the pull-down node PD becomes an effective potential. The twelfth transistor M12 and the thirteenth transistor M13 are turned on under the control of the pull-down node PD, and the second power supply terminal VGL inputs the second power supply signal having an ineffective potential to the output terminal OUT through the thirteenth transistor M13 and inputs the second power supply signal having an ineffective potential to pull-up node PU through the twelfth transistor M12, so as to reset the pull-up node PU and the output terminal OUT that correspond to each row of pixels before the display of each frame of image. Thus, the damage to the display panel caused by residual charges is avoided.

In summary, the embodiments of the present disclosure provide a method for driving a shift register unit. The shift register unit includes a first reset control sub-circuit, a reset sub-circuit and an output sub-circuit. The first reset control sub-circuit controls the electric potential of the second control node under the control of the electric potential of the first control node and the reset signal. The reset sub-circuit controls the electric potential of the pull-up node according to the electric potential of the second control node, to enable the electric potential of the pull-up node to maintain an effective potential after the output stage, such that the output sub-circuit reduces noise at the output terminal under the control of the pull-up node having an effective potential. Moreover, as the output sub-circuit has a great driving capability, the noise at the output terminal may be reduced faster through the drive of the output sub-circuit, thereby improving the noise reduction efficiency at the output terminal.

Figure 8:
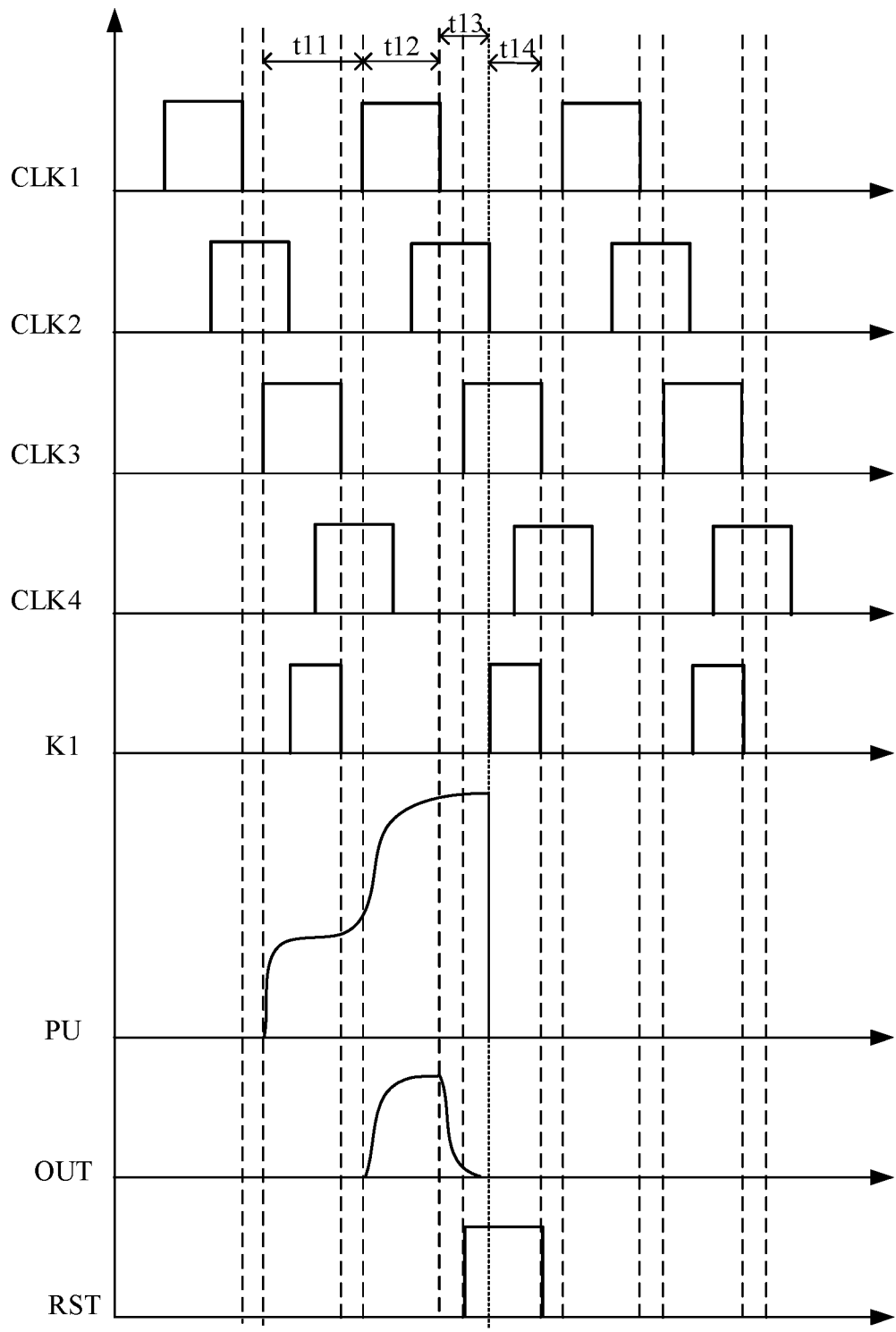
FIG. 8 is a schematic diagram of a timing sequence in a process for driving a shift register unit according to an embodiment of the present disclosure.

FIG. 8 is a schematic diagram of a timing sequence in a process for driving a shift register unit according to an embodiment of the present disclosure. The principle of driving the shift register unit provided in the embodiments of the present disclosure is illustrated in detail below by taking the shift register unit shown in FIG. 5, the transistors in the shift register unit being N-type transistors and the effective potential being a high potential with respect to the ineffective potential as an example.

Please refer to FIG. 8, during the charging stage t11, the electric potential of the input signal output by the input signal terminal IN is an effective potential, the electric potential of the first power supply signal output by the first power supply terminal VGH is an effective potential, and the electric potential of the second power supply signal output by the second power supply terminal VGL is an ineffective potential. In this case, the sixth transistor M6 is turned on under the control of the input signal, and the input signal terminal IN inputs the input signal having an effective potential to the pull-up node PU through the sixth transistor M6 to charge the pull-up node PU and capacitor C1, such that the electric potential of the pull-up node PU becomes an effective potential.

Under the control of the pull-up node PU, the ninth transistor M9 and the tenth transistor M10 are turned on. In this case, the second power supply terminal VGL inputs the second power supply signal having an ineffective potential to the pull-down node PD though the tenth transistor M10, and inputs the second power supply signal having an ineffective potential to the gate electrode of the eighth transistor M8 though the ninth transistor M9. Meanwhile, the seventh transistor M7 is turned on under the control of the first power supply signal, and the first power supply terminal VGH inputs the first power supply signal having an effective potential to the gate electrode of the eighth transistor M8 though the seventh transistor M7. Moreover, it may be designed in advance that the length-width ratio of the channel of the ninth transistor M9 is greater than the length-width ratio of the channel of the seventh transistor M7. For example, the ratio of the two length-width ratios may be 5:1, 7:1, or the like, such that the electric potential of the gate electrode of the eighth transistor M8 may maintain an ineffective potential when both the seventh transistor M7 and the ninth transistor M9 are turned on. Here, the eighth transistor M8 is turned off so that the electric potential of the pull-down node PD is pulled down to be an ineffective potential. The twelfth transistor M12 and the thirteenth transistor M13 are turned off under the control of the pull-down node PD, so as to ensure the voltage stability of the output terminal OUT.

During the outputting stage t12, the electric potential of the first clock signal output by the first clock signal terminal CLK1 is an effective potential. Meanwhile, as the electric potential of the first control node K1 is an ineffective potential, the first control node K1 controls the first reset control sub-circuit 50 to be in a non-working state, such that the reset sub-circuit 60 is also in a non-working state. Thus, the electric potential of pull-up node PU may maintain an effective potential. Moreover, as the electric potential of pull-up node PU increases by a certain degree during the charging stage t11, the fifth transistor M5 is turned on slightly under the control of the pull-up node PU, and the first clock signal terminal CLK1 may output the first clock signal to the second electrode of the fifth transistor M5. After the electric potential of the first clock signal jumps to a high electric potential during the outputting stage t12, the electric potential of pull-up node PU increases further with the increase of the electric potential of the second electrode of the fifth transistor M5 because of the coupling effect of the capacitor C1, and the fifth transistor M5 is turned on. In this case, the first clock signal terminal CLK1 may output the first clock signal having an effective potential to the output terminal OUT through the fifth transistor M5, so as to drive the pixel units in the display panel. Moreover, the electric potential of the pull-down node PD maintains an ineffective potential, the twelfth transistor M12 and the thirteenth transistor M13 are still turned off, so as to ensure the stability of the output voltage of the output terminal OUT.

During the noise pre-reducing stage t13, the electric potential of the reset signal output by the reset signal terminal RST is an effective potential and the electric potential of the second clock signal is an effective potential. The second transistor M2 is turned on under the control of the second clock signal, and the second power supply terminal VGL inputs the second power supply signal having an ineffective potential to the first control node K1 through the second transistor M2. Moreover, the electric potential of the third clock signal is an effective potential, and the first transistor M1 is turned on under the control of the third clock signal. The first power supply terminal VGH inputs the first power supply signal having an effective potential to the first control node K1 through the first transistor M1. In this case, as it is designed in advance that the length-width ratio of the channel of the second transistor M2 is greater than the length-width ratio of the channel of the first transistor M1 (for example, the ratio of the two length-width ratios may be 5:1, 6:1 or the like), both the first transistor M1 and the second transistor M2 are turned on, and the electric potential of the first control node K1 may maintain an ineffective potential. In addition, the third transistor M3 is turned off under the control of the first control node K1. In this case, the reset signal having an effective potential cannot be input to the second control node K2 through the third transistor M3, such that the electric potential of the second control node K2 still maintains an ineffective potential, and thereby the electric potential of the pull-up node PU maintains an effective potential. The fifth transistor M5 is still turned on under the control of the pull-up node PU. Meanwhile, the electric potential of the first clock signal output by the first clock signal terminal is an ineffective potential, and the first clock signal terminal CLK1 inputs the first clock signal having an ineffective potential to the output terminal OUT through the fifth transistor M5, so as to reduce noise at the output terminal OUT.

It should be noted that, as shown in FIG. 8, for some low-frequency products, in order to reduce the power consumption, the ratio of a duration of outputting a high potential to a total outputting duration in each clock signal terminal is slightly lower than 50% (that is, the duty ratio is less than 50%) under the condition of guaranteeing a charging duration. In this case, the noise pre-reducing stage t13 may further include the following process. The electric potential of the reset signal output by the reset signal terminal RST is an ineffective potential and the electric potential of the second clock signal output by the second clock signal terminal CLK2 is an effective potential. The second transistor M2 is turned on under the control of the second clock signal, and the second power supply terminal VGL inputs the second power supply signal having an ineffective potential to the first control node K1 through the second transistor M2. The electric potential of the third clock signal output by the third clock signal terminal CLK3 is an ineffective potential, and the first transistor M1 is turned off under the control of the third clock signal. The first power supply terminal VGH cannot input the first power supply signal having an effective potential to the first control node K1 through the first transistor M1, such that the electric potential of the first control node K1 is an ineffective potential. In this case, the third transistor M3 is turned off under the control of the first control node K1, such that the electric potential of the second control node K2 maintains an ineffective potential, and thereby the electric potential of the pull-up node PU maintains the effective potential. The fifth transistor M5 is still turned on under the control of the pull-up node PU. Meanwhile, the electric potential of the first clock signal output by the first clock signal terminal CLK1 is an ineffective potential, and the first clock signal terminal CLK1 inputs the first clock signal having an ineffective potential to the output terminal OUT through the fifth transistor M5, so as to reduce noise at the output terminal OUT.

During the noise-reducing stage t14, the electric potential of the reset signal output by the reset signal terminal RST is an effective potential and the electric potential of the second clock signal output by the second clock signal terminal CLK2 is an ineffective potential. The second transistor M2 is turned off under the control of the second clock signal, and the second power supply terminal VGL cannot input the second power supply signal having an ineffective potential to the first control node K1 through the second transistor M2. The electric potential of the third clock signal output by the third clock signal terminal CLK3 is an effective potential, and the first transistor M1 is turned on under the control of the third clock signal. The first power supply terminal VGH inputs the first power supply signal having an effective potential to the first control node K1 through the first transistor M1, such that the electric potential of the first control node K1 is an effective potential. The third transistor M3 is turned on under the control of the first control node K1, and the reset signal terminal RST inputs the reset signal having an effective potential to the second control node K2 through the third transistor M3, such that the electric potential of the second control node K2 is an effective potential. The fourth transistor M4 is turned on under the control of the second control node K2. The electric potential of the pull-down power supply signal output by the third power supply terminal VSS is an ineffective potential. The third power supply terminal VSS inputs the pull-down power supply signal having an ineffective potential to the pull-up node PU through the fourth transistor M4, so as to control the electric potential of the pull-up node PU to be an ineffective potential, thereby resetting the pull-up node PU.

Moreover, both the ninth transistor M9 and the tenth transistor M10 are turned off under the control of the pull-up node PU having an ineffective potential. Also, the electric potential of the first power supply signal output by the first power supply terminal VGH is an effective potential, the electric potential of the second power supply signal output by the second power supply terminal VGL is an ineffective potential, and the seventh transistor M7 is turned on under the control of the first power supply signal. The first power supply terminal VGH inputs the first power supply signal having an effective potential to the gate electrode of the eighth transistor M8 through the seventh transistor M7, and the eighth transistor M8 is turned on under the control of the first power supply signal. The first power supply terminal VGH inputs the first power supply signal having an effective potential to the pull-down node PD through the eighth transistor M8 to control the electric potential of the pull-down node PD to be an effective potential. The twelfth transistor M12 and the thirteenth transistor M13 are turned on under the control of the pull-down node PD. The second power supply terminal VGL inputs the second power supply signal having an ineffective potential to output terminal OUT through the thirteenth transistor M13, and the second power supply terminal VGL inputs the second power supply signal having an ineffective potential to pull-up node PU through the twelfth transistor M12, so as to reduce noise at the output terminal OUT and the pull-up node PU.

Figure 9:
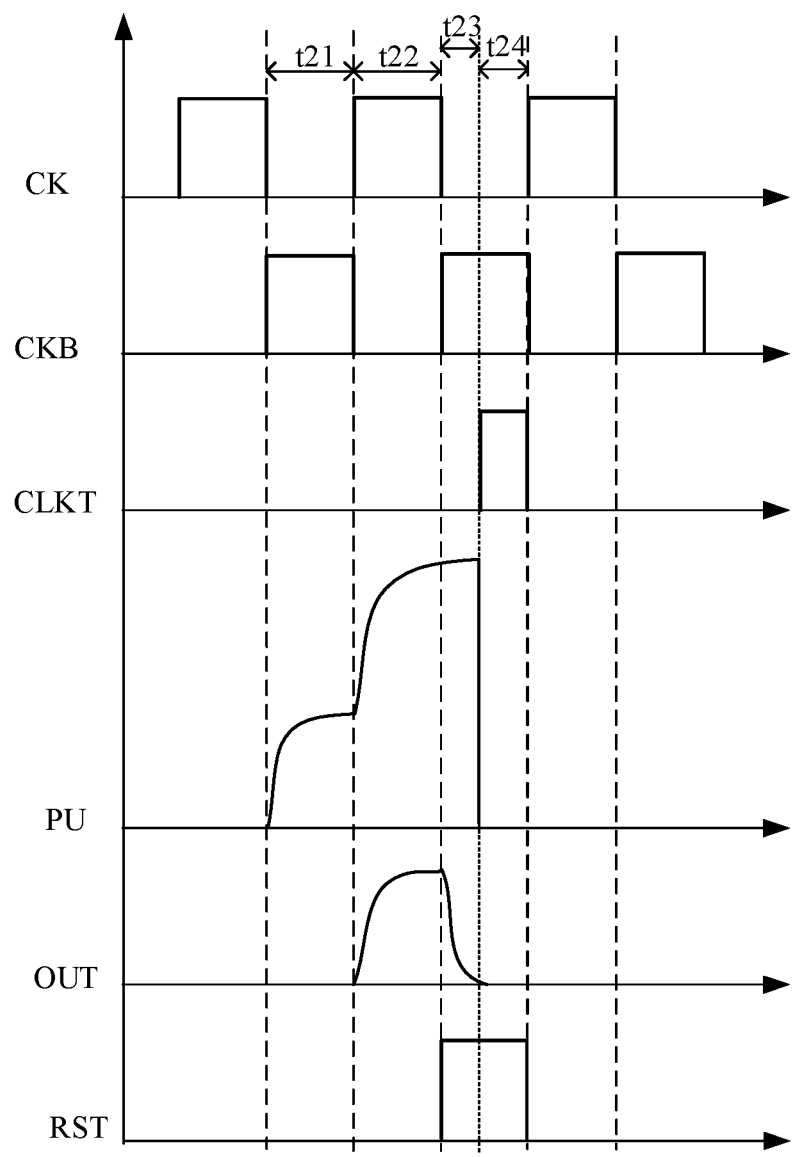
FIG. 9 is a schematic diagram of a timing sequence in a process for driving another shift register unit according to an embodiment of the present disclosure.

FIG. 9 is a schematic diagram of a timing sequence in a process for driving another shift register unit according to an embodiment of the present disclosure. The principle of driving the shift register unit provided in the embodiments of the present disclosure is illustrated in detail below by taking an example in which the first control node in the shift register unit is still connected to the control clock signal terminal, the structures of the input sub-circuit 10, the output sub-circuit 20, the pull-down control sub-circuit 30, the pull-down sub-circuit 40, the first reset control sub-circuit 50, and the reset sub-circuit 60 are shown in FIG. 5, transistors in the shift register unit are N-type transistors, and the effective potential is a high potential with respect to the ineffective potential.

Herein, in FIG. 9, CK signal is a first clock signal generated by the first clock signal terminal in an odd-stage shift register unit in a gate drive circuit, and CKB signal is a first clock signal generated by the first clock signal terminal in an even-stage shift register unit in a gate drive circuit. The ratio of a duration of outputting a high electric potential to a total outputting duration in each clock signal terminal is 50% (that is, the duty ratio is 50%). The principle of driving the shift register unit during the charging stage t21 and the outputting stage t22 may be referred to the principle of driving the shift register unit in FIG. 8 during the charging stage t11 and the outputting stage t12, which is not repeated herein.

During the noise pre-reducing stage t23, the electric potential of the reset signal output by the reset signal terminal RST is an effective potential and the electric potential of the control clock signal output by the control clock signal terminal CLKT is an ineffective potential, such that the electric potential of the first control node K1 maintains an ineffective potential. The third transistor M3 is turned off under the control of the first control node K1. In this case, the reset signal having an effective potential cannot be input to the second control node K2 through the third transistor M3, such that the electric potential of the second control node K2 still maintains the ineffective potential. Thus, the electric potential of the pull-up node PU still maintains the effective potential. The fifth transistor M5 is still turned on under the control of the pull-up node PU. Meanwhile, the electric potential of the first clock signal output by the first clock signal terminal CLK1 is an ineffective potential, and the first clock signal terminal CLK1 inputs the first clock signal having an ineffective potential to the output terminal OUT through the fifth transistor M5, so as to reduce noise at the output terminal OUT.

During the noise-reducing stage t24, the electric potential of the reset signal output by the reset signal terminal RST is an effective potential and the electric potential of the control clock signal output by the control clock signal terminal is an effective potential, such that the electric potential of the first control node K1 is an effective potential. The third transistor M3 is turned on under the control of the first control node K1, and the reset signal terminal RST inputs the reset signal having an effective potential to the second control node K2 through the third transistor M3, such that the electric potential of the second control node K2 is an effective potential. The fourth transistor M4 is turned on under the control of the second control node K2. The electric potential of the pull-down power supply signal output by the third power supply terminal VSS is an ineffective potential, and the third power supply terminal VSS inputs the pull-down power supply signal having an ineffective potential to the pull-up node PU through the fourth transistor M4, so as to control the electric potential of the pull-up node PU to be an ineffective potential, thereby resetting the pull-up node PU.

Moreover, both the ninth transistor M9 and the tenth transistor M10 are turned off under the control of the pull-up node PU having an ineffective potential. Also, the electric potential of the first power supply signal output by the first power supply terminal VGH is an effective potential, the electric potential of the second power supply signal output by the second power supply terminal VGL is an ineffective potential, and the seventh transistor M7 is turned on under the control of the first power supply signal. The first power supply terminal VGH inputs the first power supply signal having an effective potential to the gate electrode of the eighth transistor M8 through the seventh transistor M7, and the eighth transistor M8 is turned on under the control of the first power supply signal. The first power supply terminal VGH inputs the first power supply signal having an effective potential to the pull-down node PD through the eighth transistor M8 to control the electric potential of the pull-down node PD to be an effective potential. The twelfth transistor M12 and the thirteenth transistor M13 are turned on under the control of the pull-down node PD. The second power supply terminal VGL inputs the second power supply signal having an ineffective potential to output terminal OUT through the thirteenth transistor M13, and the second power supply terminal VGL inputs the second power supply signal having an ineffective potential to pull-up node PU through the twelfth transistor M12, so as to reduce noise at the output terminal OUT and the pull-up node PU.

Compared with the related art, according to the shift register unit provided in the embodiments of the present disclosure, the duration of inputting the pull-down power supply signal to the pull-up node is controlled through the electric potential of the second control node, which increases the duration of outputting the first clock signal having an ineffective potential to the output terminal through the output sub-circuit. That is, the duration of reducing noise at the output terminal through the output sub-circuit increases. Moreover, as the output sub-circuit has a great driving capability, the electric potential of the drive output terminal may be pulled to an ineffective potential faster by reducing noise at the drive output terminal through the output sub-circuit. After the duration of reducing noise at the output terminal through the output sub-circuit increases, the falling edge of the output waveform from the output terminal may be closer to an ideal waveform. Thus, the noise reduction efficiency for the output terminal is improved effectively, thereby driving the pixel units in the display panel more accurately.

There is provided a gate drive circuit in the embodiments of the present disclosure. The gate drive circuit may include a plurality of cascaded shift register units, and each shift register unit is the shift register unit shown in any one of FIG. 1 to FIG. 6.

When the electric potential of the first control node K1 is controlled through the first implementation, each shift register unit in the gate drive circuit includes: a second reset control sub-circuit 70. The second reset control sub-circuit 70 is connected respectively to the second clock signal terminal CLK2, the third clock signal terminal CLK3, the second power supply terminal VGL, and the first control node K1. Among the plurality of shift register units, the output terminal OUT of the $(j+2)^{th}$ shift register unit is connected to the reset signal terminal RST of the $j^{th}$ shift register unit. The first clock signal terminal CLK1 of the $(j+1)^{th}$ shift register unit is connected to the second clock signal terminal CLK2 of the $j^{th}$ shift register unit. The second clock signal terminal CLK2 of the $(j+1)^{th}$ shift register unit is connected to the third clock signal terminal CLK3 of the $j^{th}$ shift register unit. Meanwhile, the input signal terminal IN of the $(j+2)^{th}$ shift register unit may be connected to the output terminal OUT of the $j^{th}$ shift register unit, and the input signal terminal IN of the first shift register unit is connected to a first activating signal terminal IN1. The first activating signal terminal IN1 is configured to provide a first activating signal to the input signal terminal IN of the first shift register unit. The input signal terminal IN of the second shift register unit is connected to a second activating signal terminal IN2. The second activating signal terminal IN2 is configured to provide a second activating signal to the input signal terminal IN of the second shift register unit. The time difference between a middle point of the effective electric potential stage of first activating signal and a middle point of the effective electric potential stage of the second activating signal is an outputting duration for a row of GOAs. Herein, j is a positive integer. In this case, the gate drive circuit may be provided with 4 clock signal terminals. The 4 clock signal terminals output clock signals CK1 to CK4, respectively. The 4 clock signals have the same cycle and duty ratio. Moreover, during each clock cycle, the time difference between the middle points of the effective electric potential stages of adjacent two clock signals is the outputting duration for a row of GOAs. The electric potential of CK3 jumps from an ineffective potential to an effective potential when the electric potential of CK1 is within the ineffective potential stage, and the electric potential of CK4 jumps from an ineffective potential to an effective potential when the electric potential of CK2 is within the ineffective potential stage. Herein, the waveforms of the clock signals CK1 to CK4 may be referred to the waveform of the first clock signal from the first clock signal terminal CLK1, the waveform of the second clock signal from the second clock signal terminal CLK2, the waveform of the third clock signal from the third clock signal terminal CLK3, and the waveform of the fourth clock signal from the fourth clock signal terminal CLK4, respectively, shown in FIG. 8.

Figure 10:
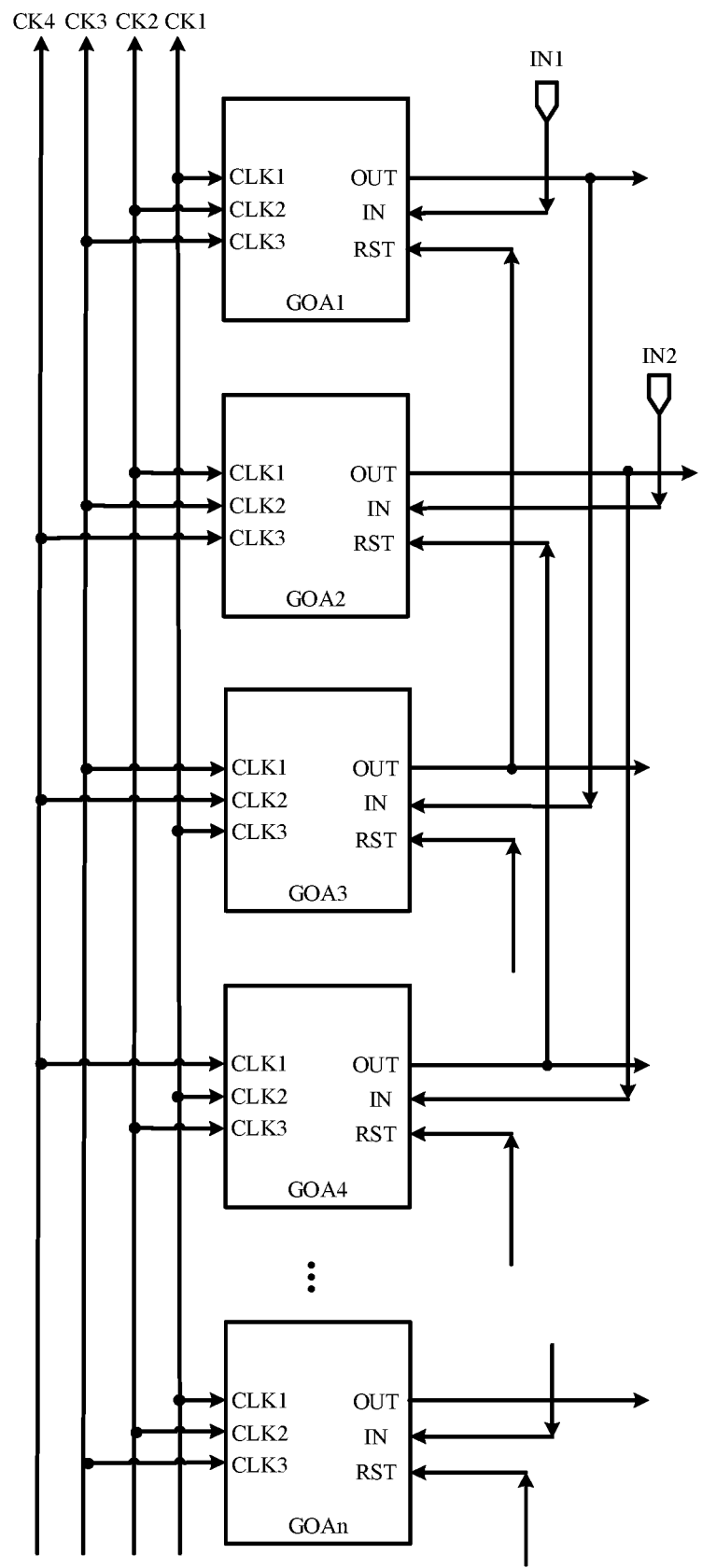
FIG. 10 is a schematic diagram of a structure of a gate drive circuit according to an embodiment of the present disclosure.

Moreover, please refer to FIG. 10, the clock signal input by the first clock signal terminal CLK1 in the first stage shift register unit GOA1 may be CK1, the clock signal input by the second clock signal terminal CLK2 may be CK2, and the clock signal input by the third clock signal terminal CLK3 may be CK3. The clock signal input by the first clock signal terminal CLK1 in the second stage shift register unit GOA2 may be CK2, the clock signal input by the second clock signal terminal CLK2 may be CK3, and the clock signal input by the third clock signal terminal CLK3 may be CK4. The clock signal input by the first clock signal terminal CLK1 in the third stage shift register unit GOA3 may be CK3, the clock signal input by the second clock signal terminal CLK2 may be CK4, and the clock signal input by the third clock signal terminal CLK3 may be CK1. The clock signal input by the first clock signal terminal CLK1 in the fourth stage shift register unit GOA4 may be CK4, the clock signal input by the second clock signal terminal CLK2 may be CK1, and the clock signal input by the third clock signal terminal CLK3 may be CK2. In addition, the input signal terminal IN of the first stage shift register unit GOA1 is connected to the first activating signal terminal IN1, the input signal terminal IN of the first stage shift register unit GOA2 is connected to the second activating signal terminal IN2, the third stage shift register unit GOA3 is connected to the output terminal OUT of the first stage shift register unit GOA1, and the fourth stage shift register unit GOA4 is connected to the output terminal OUT of the second stage shift register unit GOA2. Every 4 shift register units in the gate drive circuit may be taken as a unit to repeat the above connection.

When the electric potential of the first control node K1 is controlled through the second implementation, the first control node K1 of each shift register unit in the gate drive circuit is connected to the control clock signal terminal CLKT. In the plurality of shift register units, the output terminal OUT of the $(j+1)^{th}$ shift register unit may be connected to the reset signal terminal RST of the $j^{th}$ shift register unit. In this case, the gate drive circuit may be provided with 3 clock signal terminals. The 3 clock signal terminals output clock signals CK, CKB and CLKT, respectively. The output waveform of the clock signal CK may be the same as the output waveform of the clock signal CLK1 in FIG. 8, the output waveform of the clock signal CKB may be the same as the output waveform of the clock signal CLK3 in FIG. 8, and the output waveform of the clock signal CLKT may be the same as the waveform of the first control node K1 in FIG. 8.

In addition, the clock signal input by the first clock signal terminal CLK1 in an odd-stage shift register unit GOA1 may be CK, and the clock signal input by the first clock signal terminal CLK1 in an even-stage shift register unit GOA2 may be CKB.

It should be noted that, compared with the first way of connecting the first control node K1 and the control clock signal terminal CLKT in a shift register unit, the second way of connecting the first control node K1 and the second reset control sub-circuit in a shift register unit may adopt other stages of clock signals to generate a control signal input to the first control node K1. Thus, there is no need to add a new clock signal terminal for providing the control signal to the first control node K1, thereby reducing the global power consumption of the GOA. Therefore, the second connecting way is more advantageous.

In summary, the embodiments of the present disclosure provide a gate drive circuit. The shift register unit in the gate drive circuit includes a first reset control sub-circuit, a reset sub-circuit and an output sub-circuit. The first reset control sub-circuit controls the electric potential of the second control node under the control of the electric potential of the first control node and the reset signal. The reset sub-circuit controls the electric potential of the pull-up node according to the electric potential of the second control node, to enable a duration of maintaining an effective potential of the pull-up node to increase, such that the duration of reducing noise for the output terminal through the output sub-circuit increases. In addition, as the output sub-circuit has a great driving capability, the noise may be reduced faster for the drive output terminal through the output sub-circuit, thereby improving the noise reduction efficiency for the output terminal.

The embodiments of the present disclosure provide a display device. The display device may include the gate drive circuit provided in the embodiments of the present disclosure. The display device may be any product or part with a display function, such as a liquid crystal panel, an electronic paper, an organic light-emitting diode (OLED) panel, a mobile phone, a tablet computer, a TV, a display, a laptop computer, a digital photo frame, a navigator, etc.

The embodiments of the present disclosure further provide a storage medium, which may be a non-volatile computer-readable storage medium. The storage medium stores computer programs that, when executed by a processor, cause to implement the method for driving a shift register unit provided in the embodiments of the present disclosure.

The foregoing descriptions are merely exemplary embodiments of the present disclosure, and are not intended to limit the present disclosure. Within the spirit and principles of the present disclosure, any modifications, equivalent substitutions, improvements, etc., shall fall within the protection scope of the appended claims of the present disclosure.

What is claimed is:

1. A shift register unit, comprising: an input sub-circuit, an output sub-circuit, a pull-down control sub-circuit, a pull-down sub-circuit, a first reset control sub-circuit and a reset sub-circuit;
   wherein the input sub-circuit is connected respectively to an input signal terminal and a pull-up node, and configured to control an electric potential of the pull-up node under the control of an input signal from the input signal terminal;
   the output sub-circuit is connected respectively to a first clock signal terminal, the pull-up node and an output terminal, and configured to input a first clock signal from the first clock signal terminal to the output terminal under the control of the pull-up node;
   the pull-down control sub-circuit is connected respectively to a first power supply terminal, a second power supply terminal, the pull-up node and a pull-down node, and configured to control an electric potential of the pull-down node under the control of the pull-up node, a first power supply signal from the first power supply terminal and a second power supply signal from the second power supply terminal;
   the pull-down sub-circuit is connected respectively to the pull-up node, the pull-down node, the second power supply terminal and the output terminal, and configured to control electric potentials of the pull-up node and the output terminal under control of the pull-down node and the second power supply signal;
   the first reset control sub-circuit is connected respectively to a first control node, a reset signal terminal, and a second control node, and configured to control an electric potential of the second control node under the control of the first control node and a reset signal from the reset signal terminal; and
   the reset sub-circuit is connected respectively to the second control node, a third power supply terminal, and the pull-up node, and configured to control the electric potential of the pull-up node under the control of the second control node and a third power supply signal from the third power supply terminal,
   wherein the shift register unit further comprises a second reset control sub-circuit, the second reset control sub-circuit is connected respectively to a second clock signal terminal, a third clock signal terminal, the second power supply terminal, and the first control node, and configured to control an electric potential of the first control node under the control of the second power supply signal, a second clock signal from the second clock signal terminal and a third clock signal from the third clock signal terminal.

2. The shift register unit according to claim 1, wherein the second reset control sub-circuit comprises: a first transistor and a second transistor;
   wherein a gate electrode and a first electrode of the first transistor are connected to the third clock signal terminal, and a second electrode of the first transistor is connected to the first control node; and
   a gate electrode of the second transistor is connected to the second clock signal terminal, a first electrode of the second transistor is connected to the second power supply terminal, and a second electrode of the second transistor is connected to the first control node.

3. The shift register unit according to claim 1, wherein the first reset control sub-circuit comprises: a third transistor;
   wherein a gate electrode of the third transistor is connected to the first control node, a first electrode of the third transistor is connected to the reset signal terminal, and a second electrode of the third transistor is connected to the second control node.

4. The shift register unit according to claim 1, wherein the reset sub-circuit comprises: a fourth transistor;
wherein a gate electrode of the fourth transistor is connected to the second control node, a first electrode of the fourth transistor is connected to the third power supply terminal, and a second electrode of the fourth transistor is connected to the pull-up node.

5. The shift register unit according to claim 1, wherein the output sub-circuit comprises: a fifth transistor;
wherein a gate electrode of the fifth transistor is connected to the pull-up node, a first electrode of the fifth transistor is connected to the first clock signal terminal, and a second electrode of the fifth transistor is connected to the output terminal.

6. The shift register unit according to claim 5, wherein the output sub-circuit further comprises: a capacitor;
wherein a terminal of the capacitor is connected to the pull-up node, and the other terminal of the capacitor is connected to the output terminal.

7. The shift register unit according to claim 1, wherein the input sub-circuit comprises: a sixth transistor;
wherein a gate electrode and a first electrode of the sixth transistor are connected to the input signal terminal, and a second electrode of the sixth transistor is connected to the pull-up node.

8. The shift register unit according to claim 1, wherein the pull-down control sub-circuit comprises: a seventh transistor, an eighth transistor, a ninth transistor and a tenth transistor;
wherein a gate electrode and a first electrode of the seventh transistor are connected to the first power supply terminal, and a second electrode of the seventh transistor is connected to a gate electrode of the eighth transistor;
a first electrode of the eighth transistor is connected to the first power supply terminal, and a second electrode of the eighth transistor is connected to the pull-down node;
a gate electrode of the ninth transistor is connected to the pull-up node, a first electrode of the ninth transistor is connected to the second power supply terminal, and a second electrode of the ninth transistor is connected to the gate electrode of the eighth transistor; and
a gate electrode of the tenth transistor is connected to the pull-up node, a first electrode of the tenth transistor is connected to the second power supply terminal, and a second electrode of the tenth transistor is connected to pull-down node.

9. The shift register unit according to claim 8, wherein the pull-down control sub-circuit further comprises: an eleventh transistor;
wherein a gate electrode and a first electrode of the eleventh transistor are connected to a global reset signal terminal, and a second electrode of the eleventh transistor is connected to the pull-down node.

10. The shift register unit according to claim 1, wherein the pull-down sub-circuit comprises: a twelfth transistor and a thirteenth transistor;
wherein a gate electrode of the twelfth transistor is connected to the pull-down node, a first electrode of the twelfth transistor is connected to the second power supply terminal, and a second electrode of the twelfth transistor is connected to the pull-up node; and
a gate electrode of the thirteenth transistor is connected to the pull-down node, a first electrode of the thirteenth transistor is connected to the second power supply terminal, and a second electrode of the thirteenth transistor is connected to the output terminal.

11. The shift register unit according to claim 1, further comprising: a first transistor, a second transistor, a third transistor, a fourth transistor, a fifth transistor, a capacitor, a sixth transistor, a seventh transistor, an eighth transistor, a ninth transistor and a tenth transistor, an eleventh transistor, a twelfth transistor and a thirteenth transistor;
wherein a gate electrode and a first electrode of the first transistor are connected to the third clock signal terminal, and a second electrode of the first transistor is connected to the first control node;
a gate electrode of the second transistor is connected to the second clock signal terminal, a first electrode of the second transistor is connected to the second power supply terminal, and a second electrode of the second transistor is connected to the first control node;
a gate electrode of the third transistor is connected to the first control node, a first electrode of the third transistor is connected to the reset signal terminal, and a second electrode of the third transistor is connected to the second control node;
a gate electrode of the fourth transistor is connected to the second control node, a first electrode of the fourth transistor is connected to the third power supply terminal, and a second electrode of the fourth transistor is connected to the pull-up node;
a gate electrode of the fifth transistor is connected to the pull-up node, a first electrode of the fifth transistor is connected to the first clock signal terminal, and a second electrode of the fifth transistor is connected to the output terminal;
a terminal of the capacitor is connected to the pull-up node, and the other terminal of the capacitor is connected to the output terminal;
a gate electrode and a first electrode of the sixth transistor are connected to the input signal terminal, and a second electrode of the sixth transistor is connected to the pull-up node;
a gate electrode and a first electrode of the seventh transistor are connected to the first power supply terminal, and a second electrode of the seventh transistor is connected to a gate electrode of the eighth transistor;
a first electrode of the eighth transistor is connected to the first power supply terminal, and a second electrode of the eighth transistor is connected to the pull-down node;
a gate electrode of the ninth transistor is connected to the pull-up node, a first electrode of the ninth transistor is connected to the second power supply terminal, and a second electrode of the ninth transistor is connected to the gate electrode of the eighth transistor;
a gate electrode of the tenth transistor is connected to the pull-up node, a first electrode of the tenth transistor is connected to the second power supply terminal, and a second electrode of the tenth transistor is connected to pull-down node;
a gate electrode and a first electrode of the eleventh transistor are connected to a global reset signal terminal, and a second electrode of the eleventh transistor is connected to the pull-down node;
a gate electrode of the twelfth transistor is connected to the pull-down node, a first electrode of the twelfth transistor is connected to the second power supply terminal, and a second electrode of the twelfth transistor is connected to the pull-up node; and a gate electrode of the thirteenth transistor is connected to the pull-down node, a first electrode of the thirteenth transistor is connected to the second power supply terminal, and a second electrode of the thirteenth transistor is connected to the output terminal, wherein the first transistor and the second transistor belong to the second reset control sub-circuit, the third transistor belongs to the first reset control sub-circuit, the fourth transistor belongs to the reset sub-circuit, the fifth transistor belongs to the output sub-circuit, the sixth transistor belongs to the input sub-circuit, the seventh transistor, the eighth transistor, the ninth transistor, the tenth transistor and the eleventh transistor belong to the pull-down control sub-circuit, and the twelfth transistor and the thirteenth transistor belong to the pull-down sub-circuit.

12. The shift register unit according to claim 1, further comprising: a third transistor, a fourth transistor, a fifth transistor, a capacitor, a sixth transistor, a seventh transistor, an eighth transistor, a ninth transistor and a tenth transistor, an eleventh transistor, a twelfth transistor and a thirteenth transistor;

wherein a gate electrode of the third transistor is connected to the first control node, a first electrode of the third transistor is connected to the reset signal terminal, and a second electrode of the third transistor is connected to the second control node;

a gate electrode of the fourth transistor is connected to the second control node, a first electrode of the fourth transistor is connected to the third power supply terminal, and a second electrode of the fourth transistor is connected to the pull-up node;

a gate electrode of the fifth transistor is connected to the pull-up node, a first electrode of the fifth transistor is connected to the first clock signal terminal, and a second electrode of the fifth transistor is connected to the output terminal;

a terminal of the capacitor is connected to the pull-up node, and the other terminal of the capacitor is connected to the output terminal;

a gate electrode and a first electrode of the sixth transistor are connected to the input signal terminal, and a second electrode of the sixth transistor is connected to the pull-up node;

a gate electrode and a first electrode of the seventh transistor are connected to the first power supply terminal, and a second electrode of the seventh transistor is connected to a gate electrode of the eighth transistor;

a first electrode of the eighth transistor is connected to the first power supply terminal, and a second electrode of the eighth transistor is connected to the pull-down node;

a gate electrode of the ninth transistor is connected to the pull-up node, a first electrode of the ninth transistor is connected to the second power supply terminal, and a second electrode of the ninth transistor is connected to the gate electrode of the eighth transistor;

a gate electrode of the tenth transistor is connected to the pull-up node, a first electrode of the tenth transistor is connected to the second power supply terminal, and a second electrode of the tenth transistor is connected to pull-down node;

a gate electrode and a first electrode of the eleventh transistor are connected to a global reset signal terminal, and a second electrode of the eleventh transistor is connected to the pull-down node;

a gate electrode of the twelfth transistor is connected to the pull-down node, a first electrode of the twelfth transistor is connected to the second power supply terminal, and a second electrode of the twelfth transistor is connected to the pull-up node;

a gate electrode of the thirteenth transistor is connected to the pull-down node, a first electrode of the thirteenth transistor is connected to the second power supply terminal, and a second electrode of the thirteenth transistor is connected to the output terminal; and the first control node is further connected to a control clock signal terminal, and the control clock signal terminal is configured to output a control clock signal to control the electric potential of the first control node through the control clock signal, wherein the third transistor belongs to the first reset control sub-circuit, the fourth transistor belongs to the reset sub-circuit, the fifth transistor belongs to the output sub-circuit, the sixth transistor belongs to the input sub-circuit, the seventh transistor, the eighth transistor, the ninth transistor, the tenth transistor and the eleventh transistor belong to the pull-down control sub-circuit, and the twelfth transistor and the thirteenth transistor belong to the pull-down sub-circuit.

13. A driving method of a shift register unit which comprises an input sub-circuit, an output sub-circuit, a pull-down control sub-circuit, a pull-down sub-circuit, a first reset control sub-circuit and a reset sub-circuit, comprising:

controlling, by the input sub-circuit, an electric potential of a pull-up node to be an effective potential under the control of an input signal during a charging stage in which an electric potential of the input signal output by an input signal terminal is an effective potential;

inputting, by the output sub-circuit, a first clock signal having an effective potential to the output terminal under the control of the pull-up node during an outputting stage in which an electric potential of the first clock signal output by a first clock signal terminal is an effective potential, and the electric potential of the pull-up node maintains an effective potential;

controlling, by the first reset control sub-circuit, an electric potential of a second control node to be an ineffective potential under the control of a first control node and a reset signal and controlling, by the reset sub-circuit, the electric potential of the pull-up node to maintain an effective potential under control of the second control node during a noise pre-reducing stage in which an electric potential of a reset signal output by the reset signal terminal is an effective potential, an electric potential of the first control node is an ineffective potential; and inputting, by the output sub-circuit, the first clock signal having an ineffective potential to the output terminal under control of the pull-up node during the noise pre-reducing stage in which the electric potential of the first clock signal is an ineffective potential; and controlling, by the first reset control sub-circuit, the electric potential of the second control node to be an effective potential under the control of the first control node and the reset signal, and controlling, by the reset sub-circuit, the electric potential of the pull-up node to be an ineffective potential under the control of the second control node and a third power supply signal having an ineffective potential during a noise reducing stage in which the electric potential of the reset signal is an effective potential and the electric potential of the first control node is an effective potential; controlling, by the pull-down control sub-circuit, the electric potential of a pull-down node to be an effective potential under the control of the first power supply signal, the second power supply signal and the pull-up node during the noise reducing stage in which an electric potential of a first power supply signal output by a first power supply terminal is an effective potential and an electric potential of a second power supply signal output by a second power supply terminal is an ineffective potential; and controlling, by the pull-down sub-circuit, the electric potentials of the pull-up node and the output terminal to be ineffective potentials under the control of the pull-down node and the second power supply signal, wherein the shift register unit further comprises a second reset control sub-circuit, the second reset control sub-circuit is connected respectively to a second clock signal terminal, a third clock signal terminal, the second power supply terminal, and the first control node, and configured to control an electric potential of the first control node under the control of the second power supply signal, a second clock signal from the second clock signal terminal and a third clock signal from the third clock signal terminal.

14. The method according to claim 13, further comprising:

inputting, by the pull-down control sub-circuit, a global reset signal having an effective potential to the pull-down node under the control of the global reset signal during a global reset stage in which an electric potential of the global reset signal output by a global reset signal terminal is an effective potential.

15. A gate drive circuit, comprising a plurality of cascaded shift register units which comprise an input sub-circuit, an output sub-circuit, a pull-down control sub-circuit, a pull-down sub-circuit, a first reset control sub-circuit and a reset sub-circuit;

wherein the input sub-circuit is connected respectively to an input signal terminal and a pull-up node, and configured to control an electric potential of the pull-up node under the control of an input signal from the input signal terminal;

the output sub-circuit is connected respectively to a first clock signal terminal, the pull-up node and an output terminal, and configured to input a first clock signal from the first clock signal terminal to the output terminal under the control of the pull-up node;

the pull-down control sub-circuit is connected respectively to a first power supply terminal, a second power supply terminal, the pull-up node and a pull-down node, and configured to control an electric potential of the pull-down node under the control of the pull-up node, a first power supply signal from the first power supply terminal and a second power supply signal from the second power supply terminal;

the pull-down sub-circuit is connected respectively to the pull-up node, the pull-down node, the second power supply terminal, and the output terminal, and configured to control electric potentials of the pull-up node and the output terminal under the control of the pull-down node and the second power supply signal;

the first reset control sub-circuit is connected respectively to a first control node, a reset signal terminal, and a second control node, and configured to control an electric potential of the second control node under the control of the first control node and a reset signal from the reset signal terminal; and the reset sub-circuit is connected respectively to the second control node, a third power supply terminal, and the pull-up node, and configured to control the electric potential of the pull-up node under the control of the second control node and a third power supply signal from the third power supply terminal, wherein each of the plurality of cascaded shift register units further comprises a second reset control sub-circuit connected respectively to a second clock signal terminal, a third clock signal terminal, the second power supply terminal, and the first control node, and configured to control an electric potential of the first control node under the control of the second power supply signal, a second clock signal from the second clock signal terminal and a third clock signal from the third clock signal terminal.

16. The gate drive circuit according to claim 15, wherein an output terminal of the $(j+2)^{th}$ shift register unit is connected to a reset signal terminal of the $j^{th}$ shift register unit, a first clock signal terminal of the $(j+1)^{th}$ shift register unit is connected to a second clock signal terminal of the $j^{th}$ shift register unit, and a second clock signal terminal of the $(j+1)^{th}$ shift register unit is connected to a third clock signal terminal of the $j^{th}$ shift register unit, where j is an positive integer.

17. The gate drive circuit according to claim 15, wherein the first control node of each of the plurality of cascaded shift register units is connected to a control clock signal terminal, and an output terminal of the $(j+1)^{th}$ shift register unit is connected to the reset signal terminal of the $j^{th}$ shift register unit, where j is an positive integer.

18. A display device, comprising the gate drive circuit according to claim 15.

* * * * *